United States Patent
Yamazaki et al.

(10) Patent No.: US 7,759,629 B2
(45) Date of Patent: Jul. 20, 2010

(54) METHOD FOR MANUFACTURING A SEMICONDUCTOR DEVICE

(75) Inventors: Shunpei Yamazaki, Tokyo (JP); Atsushi Hirose, Kanagawa (JP); Koji Ono, Tochigi (JP); Hotaka Maruyama, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/043,640

(22) Filed: Mar. 6, 2008

(65) Prior Publication Data

US 2008/0230682 A1 Sep. 25, 2008

(30) Foreign Application Priority Data

Mar. 20, 2007 (JP) ............................. 2007-073186

(51) Int. Cl.
*H01L 31/18* (2006.01)
(52) U.S. Cl. ................ 250/214.1; 438/57; 257/E31.113
(58) Field of Classification Search ............ 250/214 A, 250/214.1, 208.1; 330/308; 438/57, 59, 438/60; 257/290, E31.113, E27.122, E27.113
See application file for complete search history.

(56) References Cited

U.S. PATENT DOCUMENTS 5,627,088 A * 5/1997 Fukaya et al. ................ 438/155
2006/0261253 A1* 11/2006 Arao et al. ................ 250/214.1

* cited by examiner

*Primary Examiner*—Kevin Pyo
(74) *Attorney, Agent, or Firm*—Fish & Richardson P.C.

(57) ABSTRACT

A semiconductor device is manufactured through steps in which a photoelectric conversion element and an amplifier circuit are formed over a first substrate with a release layer interposed therebetween, and the photoelectric conversion element and the amplifier circuit are separated from the first substrate. Output characteristics of the amplifier circuit are improved and the semiconductor device with high reliability is obtained. A manufacturing method of such semiconductor device includes steps of forming a metal layer having an opening portion over a substrate, forming an insulating layer over the entire surface of the substrate including the opening portion and the metal layer, forming a photoelectric conversion layer in a region which overlaps with the metal layer and is a layer over the insulating layer, forming an amplifier circuit, which amplifies an output current of the photoelectric conversion element by using a thin film transistor, in the opening portion in the metal layer, forming a protective layer over the photoelectric conversion element and the amplifier circuit, and separating the photoelectric conversion element and the amplifier circuit, together with the insulating layer, from the substrate through laser irradiation to the metal layer.

8 Claims, 23 Drawing Sheets

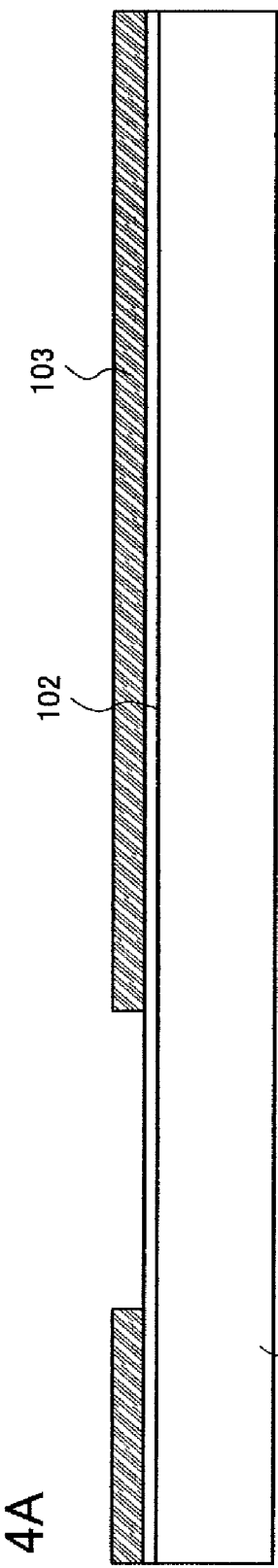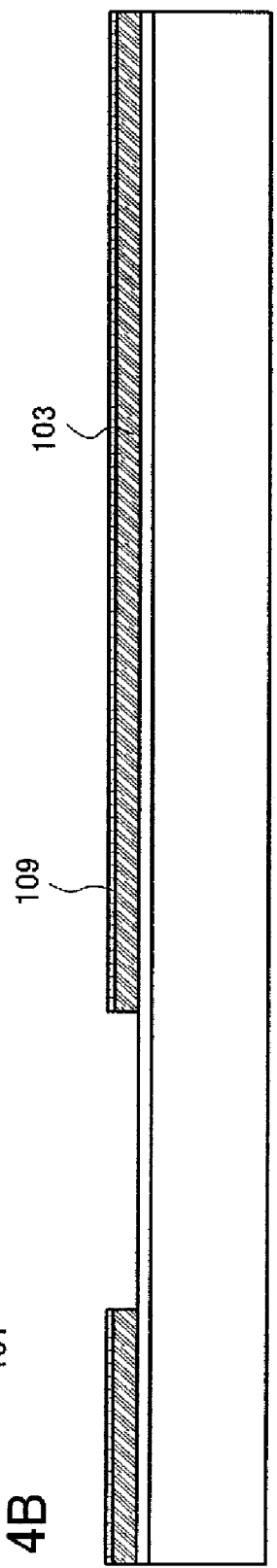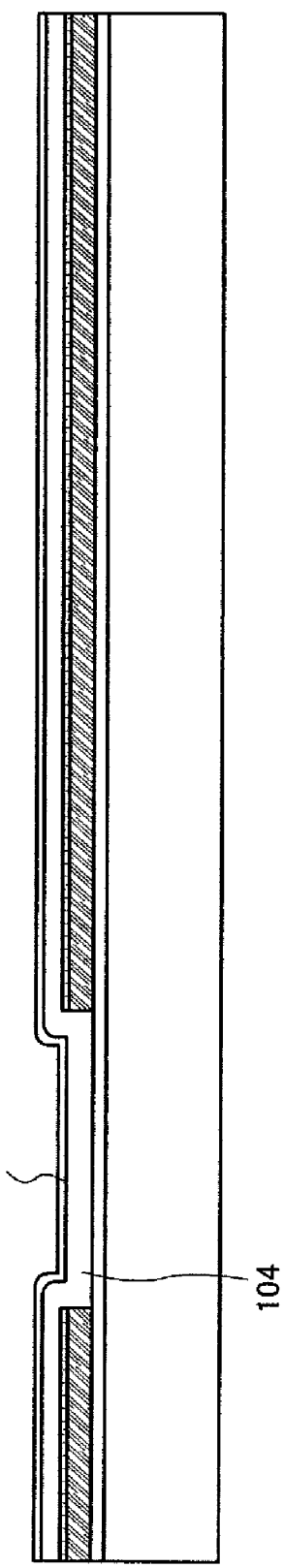

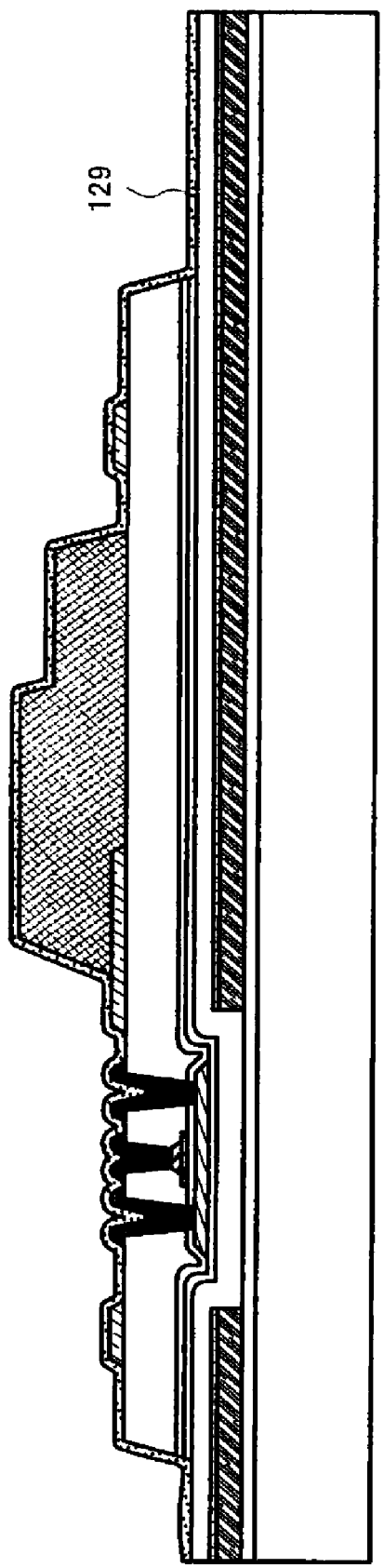
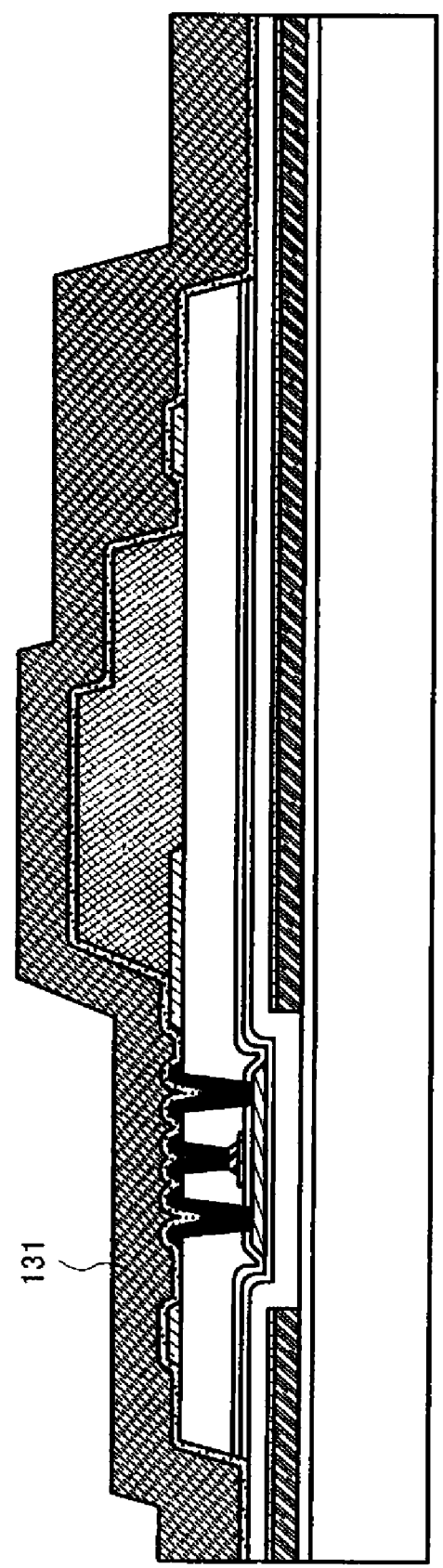
FIG. 7A
FIG. 7B

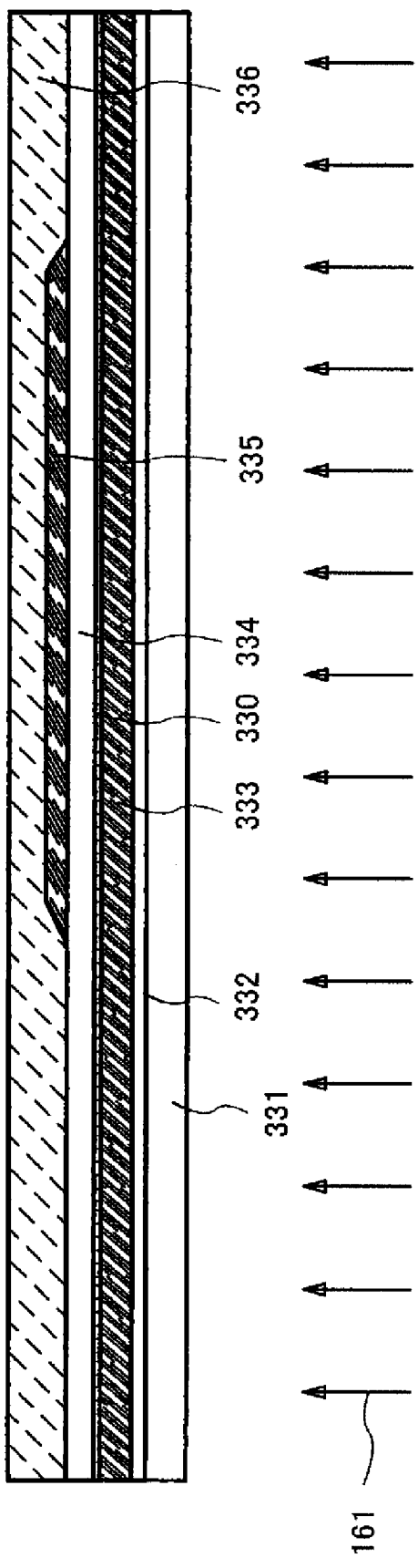
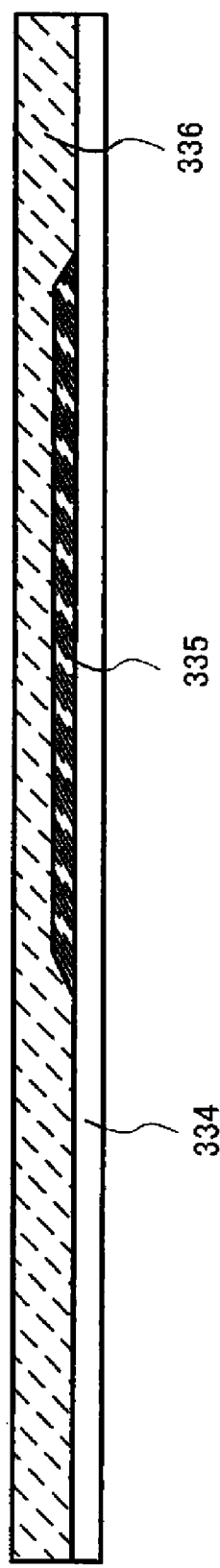

METHOD FOR MANUFACTURING A SEMICONDUCTOR DEVICE

BACKGROUND OF THE INVENTION

1. Field of the Invention

The present invention relates to a semiconductor device in which an integrated circuit is formed by using a semiconductor layer. Particularly, the present invention relates to a manufacturing method of a semiconductor device including a sensor such as a photoelectric conversion element, and an active circuit.

2. Description of the Related Art

A number of photoelectric conversion elements using for detecting electromagnetic waves are generally known, and for example, a photoelectric conversion element having sensitivity to ultra-violet rays to infrared rays is referred to as a light sensor (also referred to as photosensor) in general. A light sensor having sensitivity to a visible light region with a wavelength of 400 nm to 700 nm is particularly referred to as a visible light sensor, and a large number of visible light sensors are used for devices which need illuminance adjustment, on/off control depending on human living environment, or the like.

In particular, in a display device, brightness in the periphery of the display device is detected so as to adjust display luminance thereof. It is because unnecessary electric-power can be reduced by detecting ambient brightness and obtaining appropriate display luminance. For example, such a light sensor for adjusting luminance is used for a mobile phone and a personal computer.

In addition, as well as ambient brightness, luminance of a backlight of a display device, particularly, a liquid crystal display device is also detected by a light sensor to adjust luminance of a display screen.

In such a light sensor, a photodiode is used for a sensing part and an output current of the photodiode is amplified in an amplifier circuit. As such an amplifier circuit, for example, a current mirror circuit is used (refer to Patent Document 1: PCT International Publication No. 04/068582).

According to Patent Document 1, a light sensor is manufactured over a first substrate, separated from it and then attached on a second substrate sequentially.

In addition, a technique is known in which an element is formed over a substrate with a release layer interposed therebetween and the substrate and the element is separated by laser irradiation (refer to Patent Document 2: Japanese Published Patent Application No. 2003-163337, and Patent Document 3: Japanese Published Patent Application No. 2004-221568).

According to Patent Documents 2 and 3, a metal layer such as tungsten (W) layer can be used as the release layer.

SUMMARY OF THE INVENTION

However, in the case where a photoelectric conversion element and an amplifier circuit are manufactured over a metal layer such as tungsten, there is a problem that output characteristics of the amplifier circuit vary after the separation step.

For example, in case the metal remains under the semiconductor layer of the separated amplifier circuit, there is a problem that the remaining metal functions as a gate metal, which is not intended to make, with the result that the metal varies the output characteristics of the amplifier circuit from its intended characteristics An object of the present invention is to stably produce a semiconductor device including a plurality of functions such as the photoelectric conversion element and the active circuit, without varying characteristics of the semiconductor device.

By providing a release layer over a region where the amplifier circuit is not formed, separation can be performed and adverse effect on the output characteristics of the amplifier circuit can be prevented.

The present invention relates to a manufacturing method of the semiconductor device described below.

The present invention relates to a method for manufacturing a semiconductor device including the steps of forming a metal layer having an opening portion over a substrate, forming an insulating layer over the entire surface of the substrate including the opening portion and the metal layer, forming a photoelectric conversion layer in a region which overlaps with the metal layer and is a layer over the insulating layer, forming an amplifier circuit, which is configured to amplify an output current of the photoelectric conversion element by using a thin film transistor, in the opening portion in the metal layer, forming a protective layer over the photoelectric conversion element and the amplifier circuit, and peeling the photoelectric conversion element and the amplifier circuit, together with the insulating layer, off the substrate through laser irradiation to the metal layer.

In present invention, the metal layer is formed of any one of titanium (Ti), zirconium (Zr), hafnium (Hf), vanadium (V), tantalum (Ta), niobium (Nb), tungsten (W), molybdenum (Mo), chromium (Cr), technetium (Tc), rhenium (Re), iron (Fe), ruthenium (Ru), osmium (Os), cobalt (Co), rhodium (Rh), iridium (Ir), nickel (Ni), and palladium (Pd).

In the present invention, the amplifier circuit is a current mirror circuit.

By employing the present invention, a semiconductor device which can be separated without adversely affecting output characteristics of an amplifier circuit is obtained. Therefore, a thinner and lighter semiconductor device with high reliability can be obtained.

BRIEF DESCRIPTION OF THE DRAWINGS

In the accompanying drawings:

FIGS. 4A to 4C are cross-sectional views of a manufacturing process of a semiconductor device of the present invention;

FIGS. 7A and 7B are cross-sectional views of a manufacturing process of a semiconductor device of the present invention;

FIGS. 14A and 14B are cross-sectional views of a manufacturing process of a semiconductor device of the present invention;

DETAILED DESCRIPTION OF THE INVENTION

Figure 1:
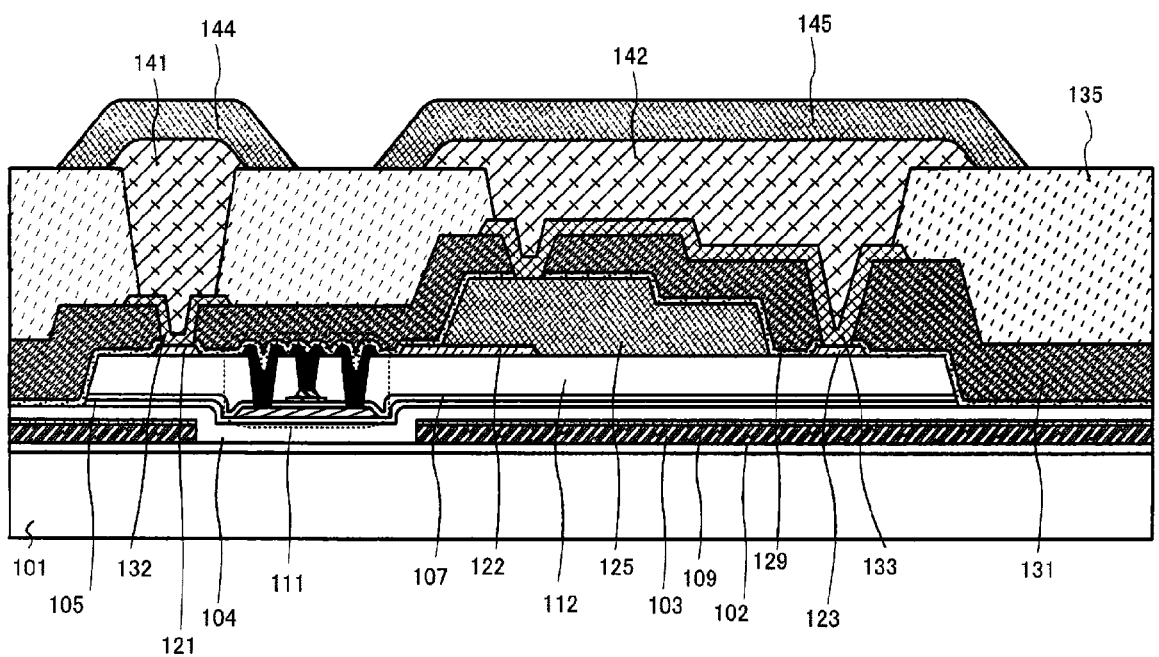
FIG. 1 is a cross-sectional view of a semiconductor device of the present invention.

Embodiment modes of the present invention will be described with reference to the drawings.

Note that the present invention can be implemented in different modes, and it is easily understood by those skilled in the art that the mode and details can be variously modified without departing from the purpose and scope of the present invention. Therefore, the invention should not be construed as being limited to the description of the embodiment modes.

Note that throughout the drawings for describing the embodiment modes of the present invention, the same portions or portions having similar functions are denoted by the same reference numerals, and description thereof will be omitted.

Embodiment Mode 1

This embodiment mode will be described below with reference to FIG. 1, FIG. 2, FIG. 3, FIGS. 4A to 4C, FIGS. 5A to 5C, FIGS. 6A to 6C, FIGS. 7A and 7B, FIGS. 8A and 8B, FIG. 9, FIGS. 10A and 10B, FIG. 11, FIG. 12, FIG. 13, FIGS. 14A and 14B, and FIG. 15.

First, an insulating layer 102 is formed over a substrate 101. As the substrate 101, one of a glass substrate, a quartz substrate, a ceramic substrate, a silicon substrate, a metal substrate, a stainless-steel substrate, and the like can be used. However, in a separation step to be described hereinafter, in the case where the substrate 101 is irradiated with laser from a surface side opposite to a surface where elements are formed, the substrate 101 should be a light-transmitting substrate. In this embodiment mode, a glass substrate is used as the substrate 101.

As the insulating layer 102, a layer may be formed of silicon oxide, silicon oxide containing nitrogen, silicon nitride, silicon nitride containing oxygen, or a metal oxide material by sputtering or plasma CVD. The insulating layer 102 may be a single layer or a stacked layers of above-described layers. In addition, when the insulating layer 102 is not necessarily required, it needs not to be formed. In this embodiment mode, a silicon oxide layer containing nitrogen is formed as the insulating layer 102.

Next, a metal layer 103 is formed over the insulating layer 102 or part of region in the substrate 101. As the metal layer 103, titanium (Ti), zirconium (Zr), hafnium (Hf), vanadium (V), tantalum (Ta), niobium (Nb), tungsten (W), molybdenum (Mo), chromium (Cr), technetium (Tc), rhenium (Re), iron (Fe), ruthenium (Ru), osmium (Os), cobalt (Co), rhodium (Rh), iridium (Ir), nickel (Ni), palladium (Pd), or the like can be used. In this embodiment mode, a tungsten layer is formed as the metal layer 103. After forming the metal layer, an opening portion is formed by etching the partial portion of the metal layer (see FIG. 4A).

Next, the surface of the metal layer 103 is oxidized to form an oxide layer in the upper layer of the metal layer 103. This oxide layer is to be a release layer 109 (see FIG. 4B).

As a typical example of the release layer 109, titanium oxide, zirconium oxide, hafnium oxide, vanadium oxide, tantalum oxide, niobium oxide, tungsten oxide, molybdenum oxide, chromium oxide, technetium oxide, rhenium oxide, iron oxide, ruthenium oxide, osmium oxide, cobalt oxide, rhodium oxide, iridium oxide, nickel oxide, palladium oxide, or the like can be given. Note that among metal oxide, the bonding number of oxygen, and wavelength of light to be absorbed are different by valence number of a metal element. Therefore, the wavelength of a laser beam to be used for laser irradiation of the release layer 109 is selected as appropriate in accordance with the release layer 109.

As a method for oxidizing the metal layer 103, heating in an oxygen atmosphere (heating by using an electric furnace or a lamp), plasma treatment by oxygen plasma, dinitrogen monoxide plasma, ozone plasma, or the like, ashing by oxygen, oxide treatment by liquid water having oxidizability such as ozone water or water can be given. Here, dinitrogen monoxide plasma treatment is performed to the surface of the metal layer 103 which is the tungsten layer to form a tungsten oxide layer as the release layer 109 with a thickness of 5 to 50 nm, preferably, 10 to 30 nm.

In addition, not only the surface of the metal layer 103 but also the whole metal layer 103 can be oxidized.

Instead of the metal layer 103, an above-described oxide layer can be formed as the release layer 109 over the insulating layer 102 or the substrate 101 by coating, vapor deposition, vacuum vapor deposition, sputtering, or CVD (chemical vapor deposition).

However, the metal layer 103 or the release layer 109 is not formed in a region 152 where an amplifier circuit such as a current mirror circuit is formed in the following step. Therefore, a photoelectric conversion element 100 has the region 152 where the metal layer 103 or the release layer 109 is not formed, and a region 151 where the metal layer 103 or the release layer 109 is formed. In the region 151, a photoelectric conversion layer 125, electrodes 121, 122, and 123, and the like are formed while an amplifier circuit is formed in the region 152 (see FIG. 3). Moreover, the region 152 preferably has a long stripe shape which is good for easy separation, but not a complicated form like an L shape.

Next, an insulating layer 104 is formed over the release layer 109 and the insulating layer 102. The insulating layer 104 may be formed of the same material as the insulating layer 102, and may have a plurality of layers or a single layer. In this embodiment mode, a silicon oxide layer including nitrogen is formed as the insulating layer 104. Note that although in this embodiment the insulating layer 104 is formed by using two layers, the insulating layer 104 is not limited thereto. It may be a single layer or a stacked layer of three or more layers.

Next, an insulating layer 105 is formed over an insulating layer 104 (see FIG. 4C). As a material for the insulating layer 105, the same material as the insulating layer 102 can be used. In this embodiment mode, a stacked layer of a silicon nitride layer including oxygen and a silicon oxide layer including nitrogen is formed as the insulating layer 105.

A semiconductor layer is formed over the insulating layer 105 and a crystalline semiconductor layer is obtained by crystallizing the semiconductor layer. Further, an island-shaped semiconductor layer 205 is formed within the region 152 by using the crystalline semiconductor layer.

In the island-shaped semiconductor layer 205, a source region, a drain region, and a channel formation region are formed.

Figure 5A:
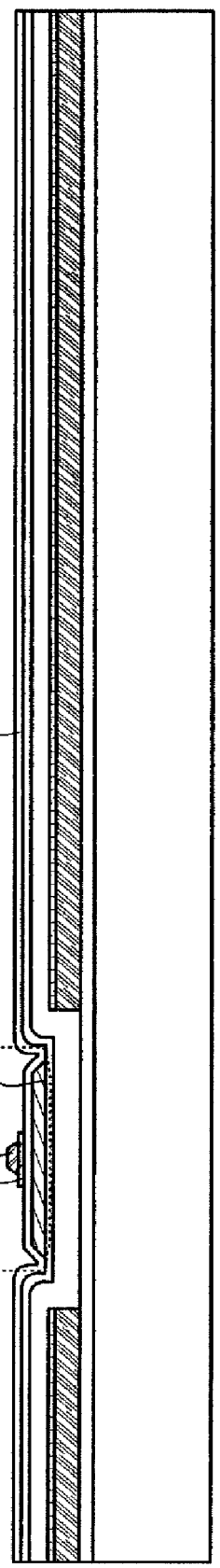
FIGS. 5A to 5C are cross-sectional views of a manufacturing process of a semiconductor device of the present invention.

In addition, a lower gate electrode 207 and an upper gate electrode 208 are formed over a gate insulating layer 107 covering the island-shaped semiconductor layer 205 and a channel formation region of the island-shaped semiconductor layer 205 (see FIG. 5A). In FIG. 5A, the gate electrode has a two layer structure of the lower gate electrode 207 and the upper gate electrode 208; alternatively, a gate electrode having a single layer structure may be formed. Note that the lower gate electrode 207 and the upper gate electrode 208 are collectively used as a gate electrode. Through the above steps, a TFT 111 is formed.

Note that in this embodiment mode, the TFT 111 is a top gate TFT; however a bottom gate TFT may be formed instead. Further, a single gate TFT having one channel formation region or a multi-gate TFT having a plurality of channel formation regions may be formed.

Figure 5B:
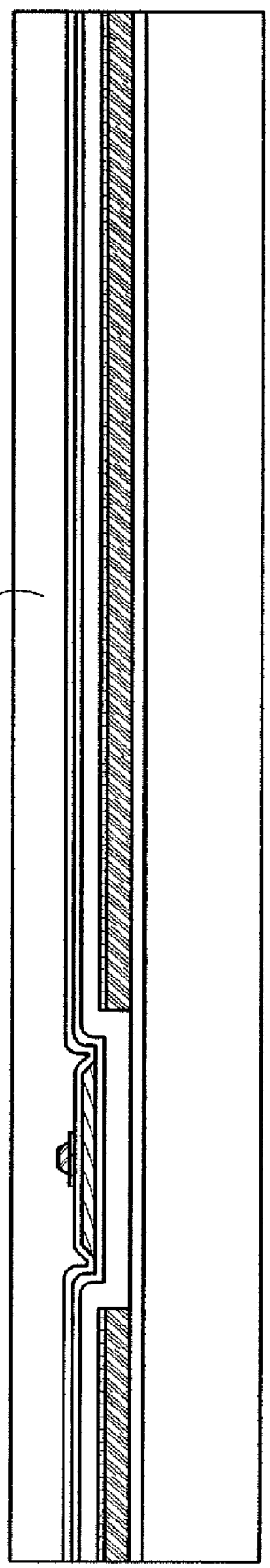

An interlayer insulating layer 112 is formed to cover the gate electrode having the lower gate electrode 207 and the upper gate electrode 208, and the gate insulating layer 107 (see FIG. 5B).

Note that the interlayer insulating layer 112 may be a single layer insulating layer or a stacked layer of insulating layers made of different materials.

The interlayer insulating layer 112, the gate insulating layer 107, and the insulating layer 105 are etched so that end portions thereof have a tapered shape.

By etching the insulating layer 105, the gate insulating layer 107, and the interlayer insulating layer 112 to make their end portions tapered, coverage of a protective layer 129 which is formed over these layers is improved so that water and impurities are less likely to get inside.

Over the interlayer insulating layer 112, a source electrode 212 and a drain electrode 213 which are electrically connected to the source region and the drain region, respectively, in the island-shaped semiconductor layer 205 are formed. In addition, a gate wiring 211 electrically connected to the gate electrode is formed (see FIG. 5C).

In this embodiment mode, the source electrode 212, the drain electrode 213, and the gate wiring 211 are formed after the interlayer insulating layer 112, the gate insulating layer 107, and the insulating layer 105 are etched so that the end portions thereof have a tapered shape; however, the source electrode 212, the drain electrode 213, and the gate wiring 211 may be formed before the interlayer insulating layer 112, the gate insulating layer 107, and the insulating layer 105 are etched so that the end portions thereof have a tapered shape.

Figure 5C:
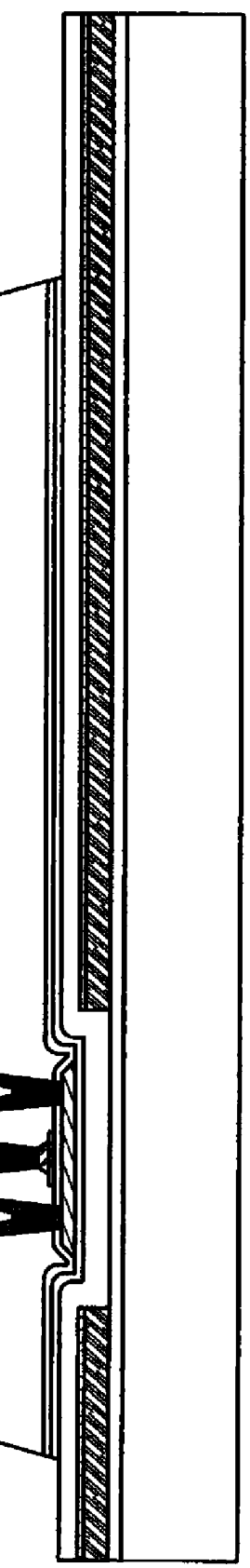
Figure 9:
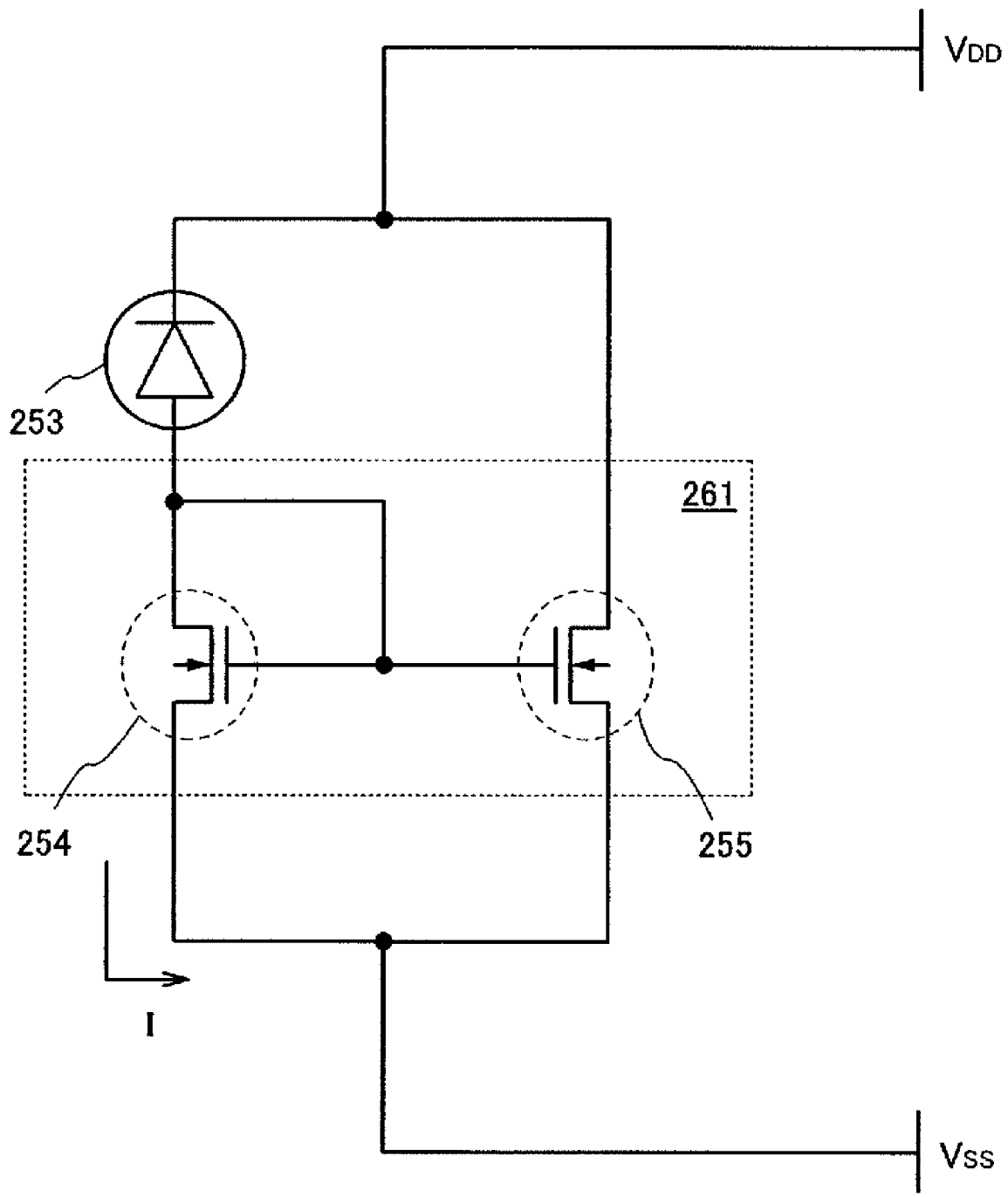
FIG. 9 is a circuit diagram of a semiconductor device of the present invention.

Note that through steps up to and including the step shown in FIG. 5C, only one TFT is shown. However, the TFT 111 is a TFT forming an amplifier circuit which amplifies photocurrent obtained in the photoelectric conversion layer 125, for example, a current mirror circuit, so that at least two transistors are formed. FIG. 9 shows a circuit configuration of a photodiode 253 having the photoelectric conversion layer 125 and a current mirror circuit 261 including a TFT 254 and a TFT 255. The TFT 111 in FIG. 5B is either the TFT 254 or the TFT 255.

In FIG. 9, a gate electrode of the TFT 254 forming the current mirror circuit 261 is electrically connected to a gate electrode of the TFT 255 which is another TFT forming the current mirror circuit 261, and further electrically connected to a drain electrode (also referred to as "drain terminal") which is one of the source electrode and drain electrode of the TFT 254.

The drain terminal of the TFT 254 is electrically connected to the photodiode 253, the drain terminal of the TFT 255, and a high potential power supply $V_{DD}$.

The source electrode (also referred to as "source terminal") of the TFT 254 which is the other of the source electrode and drain electrode is electrically connected to a low potential power supply $V_{SS}$ and a source terminal of the TFT 255.

Further, the gate electrode of the TFT 255 forming the current mirror circuit 261 is electrically connected to the gate electrode and the drain terminal of the TFT 254.

Further, the gate electrodes of the TFT 254 and TFT 255 are connected to each other, so that a common potential is applied thereto.

FIG. 9 illustrates an example of a current mirror circuit having two TFTs. Provided that the TFTs 254 and 255 have the same characteristics, the ratio of a reference current to an output current is 1:1.

Figure 10A:
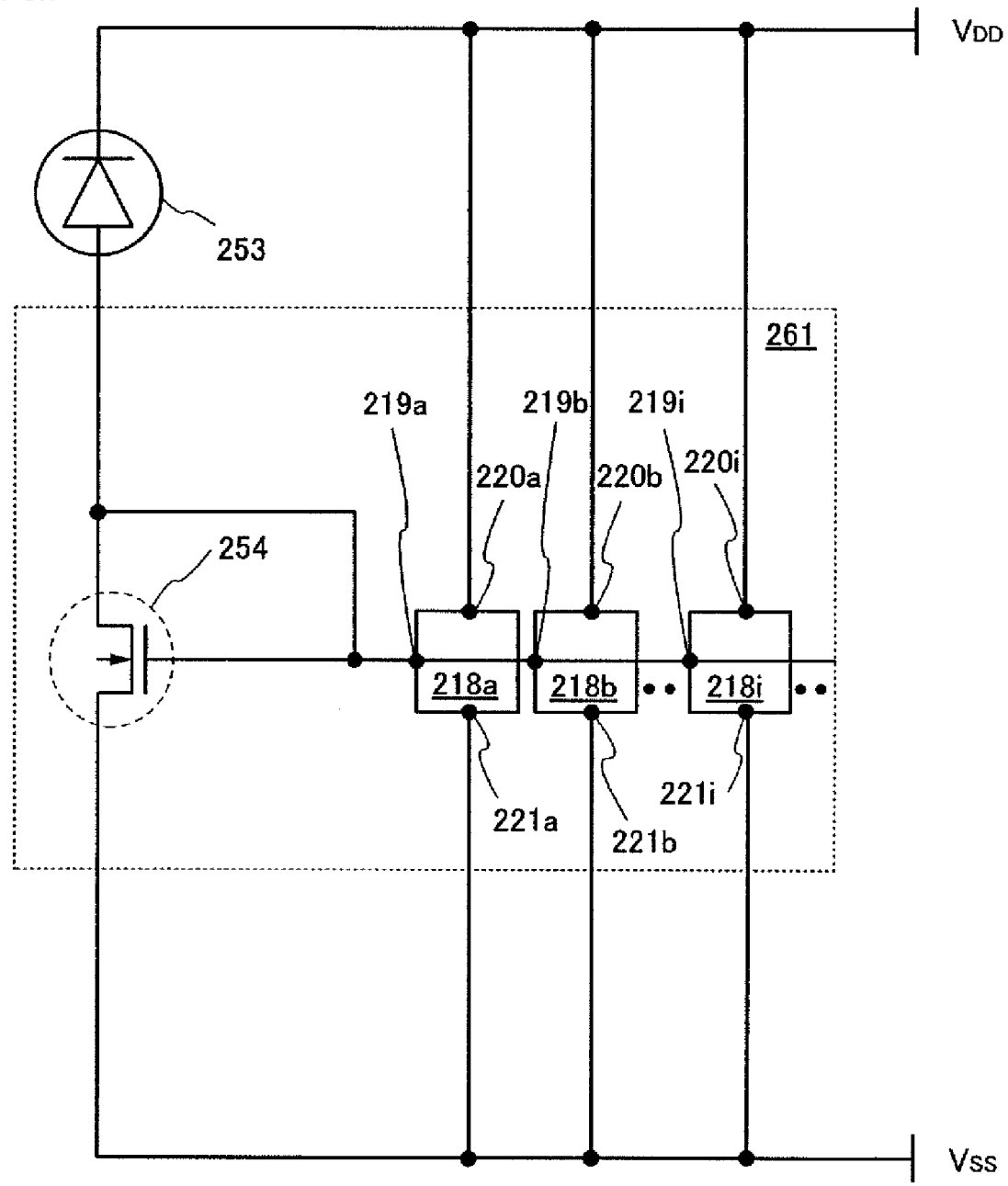
FIGS. 10A and 10B are circuit diagrams of a semiconductor device of the present invention.
Figure 10B:
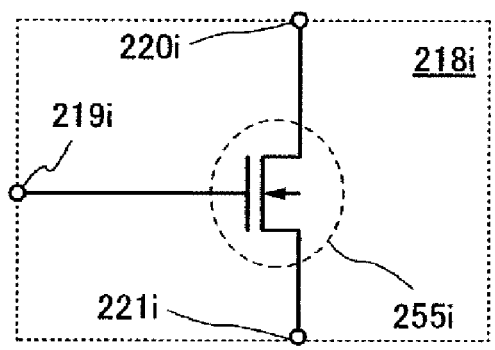

FIGS. 10A and 10B illustrate circuit configurations in which an output value can be increased by n times. The circuit configurations of FIGS. 10A and 10B correspond to the configuration in which n TFTs 255 in FIG. 9 are provided. When the ratio of the TFT 254 to the TFTs 255 is set at 1:n as shown in FIGS. 10A and 10B, the output value can be increased by n times. This serves the same principle as a configuration in which the channel width W of a TFT is increased so as to increase the limit of the current flow through the TFT by n times.

For example, in order to increase an output value by 100 times as large, the desired current can be obtained by connecting one n-channel TFT 254 and 100 n-channel TFTs 255 in parallel.

FIG. 10B shows a specific circuit configuration of a circuit 218*i* (e.g., circuits 218*a*, 218*b*, and the like) shown in FIG. 10A.

The circuit configuration of FIG. 10B is based on the circuit configurations of FIGS. 9 and 10A, and components that are common to FIGS. 9, 10A, and 10B are denoted by the same reference numerals. A gate electrode of a TFT 255*i* is electrically connected to a terminal 219*i* and is further electrically connected to a terminal 220*i*, and a source terminal of the TFT 255*i* is electrically connected to a terminal 221*i*.

In order to explain the circuits 218*a* and 218*b*, and the like in FIG. 10A, one of them, i.e., the circuit 218*i* is shown as a representative example in FIG. 10B. Since the circuit 218*i* is based on the circuit configuration of FIG. 9, reference numerals with "i" in FIGS. 10A and 10B denote the same components as those without "i" in FIG. 9. That is, the TFT 255 in FIG. 9 and the TFT 255*i* in FIG. 10B, for example, are the same TFTs.

Therefore, the TFT 255 corresponds to n TFTs 255*a*, 255*b* . . . 255*i*, and the like in FIG. 10A. Accordingly, a current flow through the TFT 254 can be amplified by n times to be output.

Note that components that are common to FIGS. 9, 10A, and 10B are denoted by the same reference numerals.

In addition, although FIG. 9 illustrates an equivalent circuit of the current mirror circuit 261 using n-channel TFTs, the n-channel TFTs may be replaced with p-channel TFTs.

Figure 11:
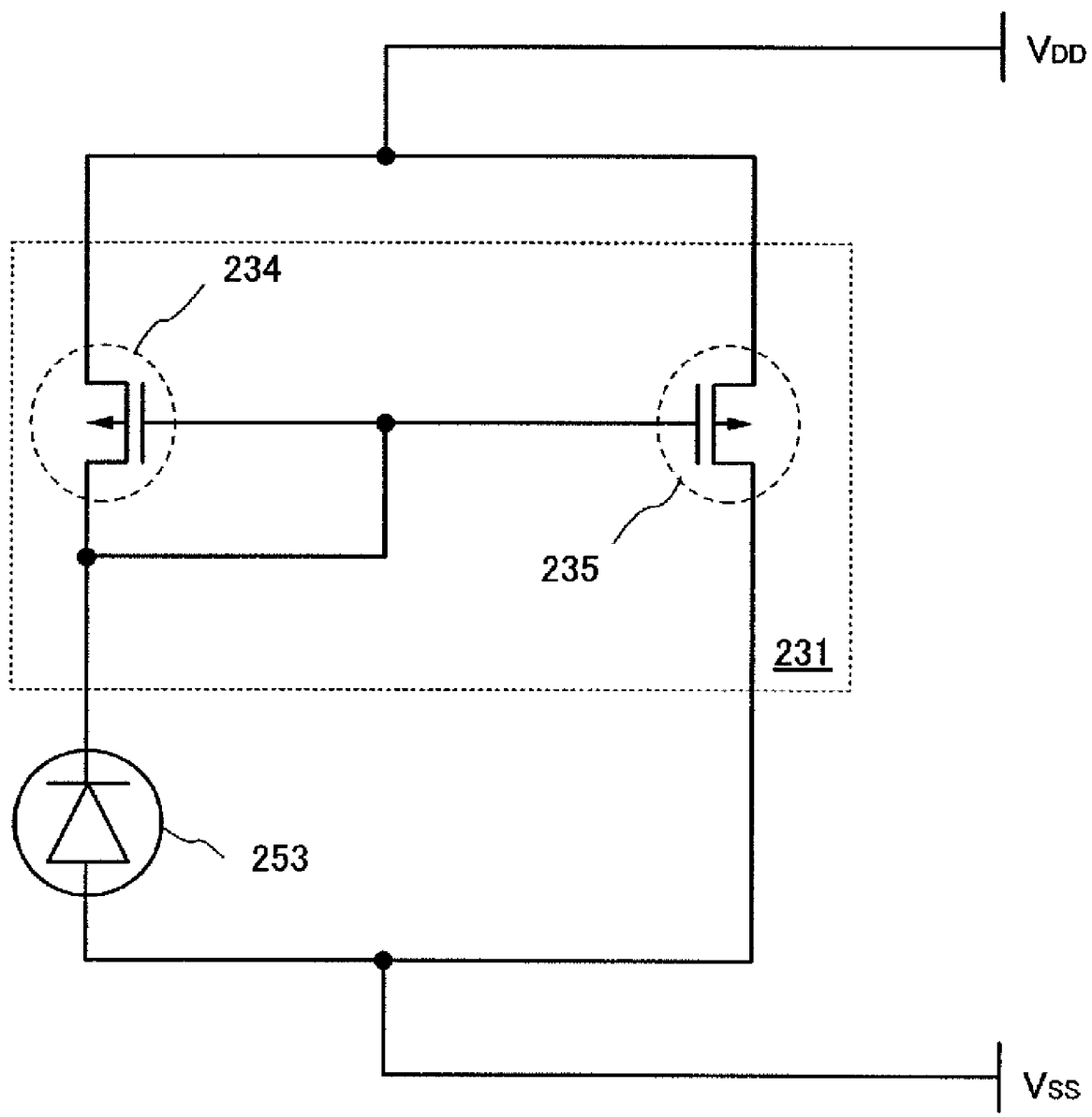
FIG. 11 is a circuit diagram of a semiconductor device of the present invention.

When the amplifier circuit is formed using p-channel TFTs, an equivalent circuit shown in FIG. 11 is obtained. As shown in FIG. 11, a current mirror circuit 231 includes p-channel TFTs 234 and 235. Note that components common to FIGS. 9 to 11 are denoted by the same reference numerals.

Figure 6A:
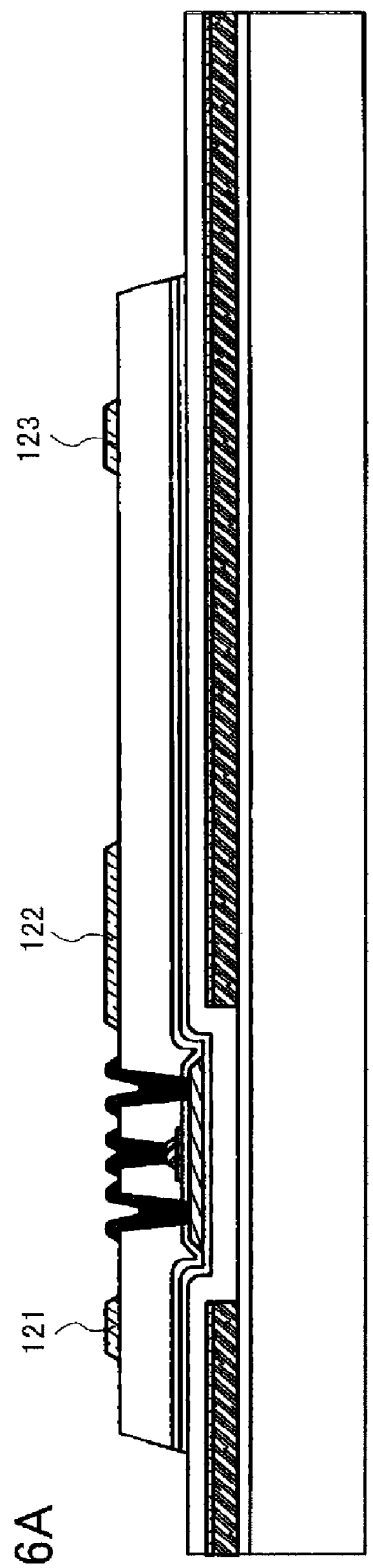
FIGS. 6A to 6C are cross-sectional views of a manufacturing process of a semiconductor device of the present invention.

After the TFT 111 is formed as described above, the electrodes 121, 122, and 123 are formed over the interlayer insulating layer 112 (FIG. 6A).

Note that in this embodiment mode, the electrodes 121, 122, and 123 are formed by depositing titanium (Ti) to a thickness of 400 nm.

Note that the electrodes 121, 122, and 123 may be formed through the same steps as the source electrode 212 and drain electrode 213.

Figure 2:
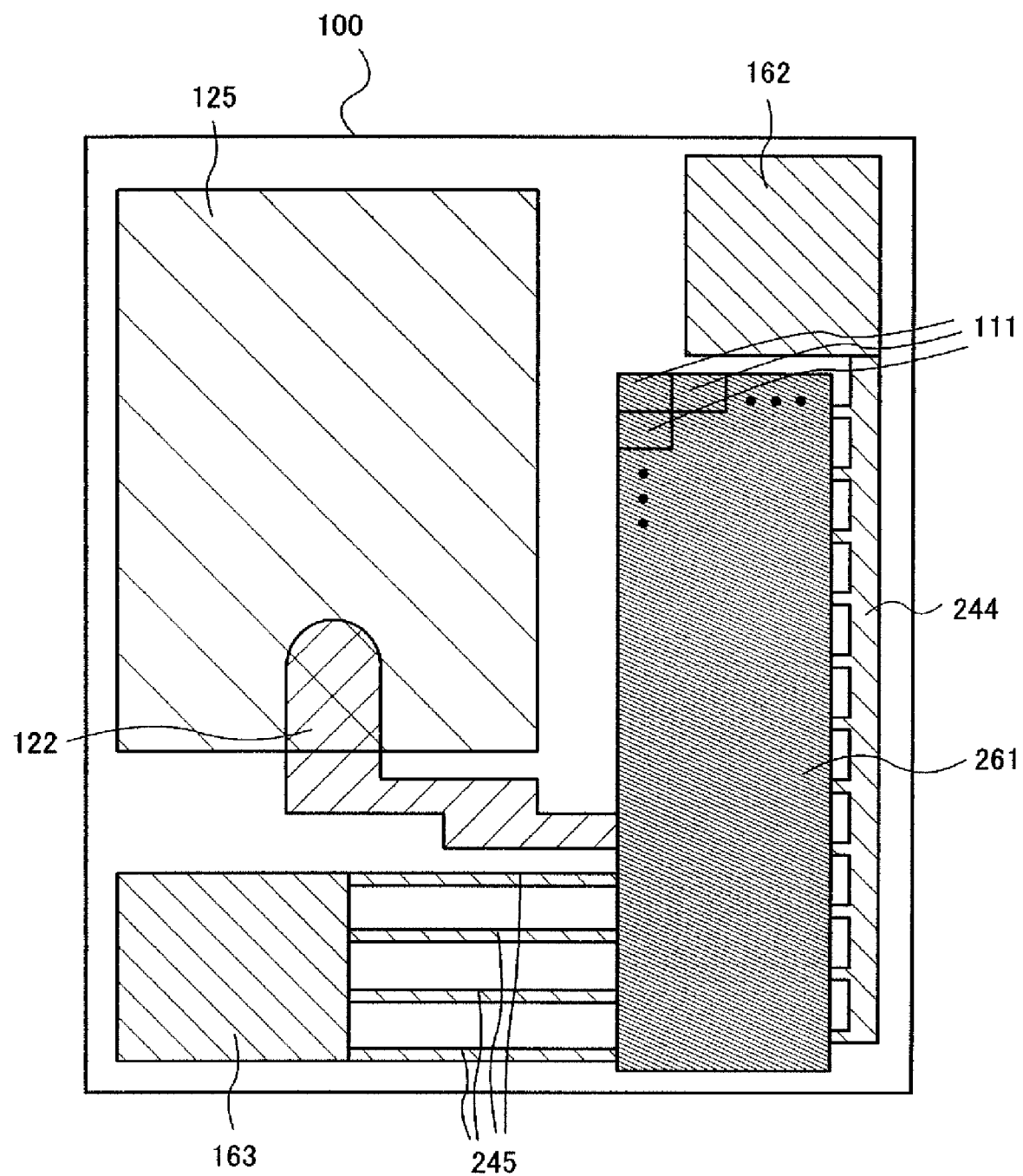
FIG. 2 is a top view of a semiconductor device of the present invention.
Figure 3:
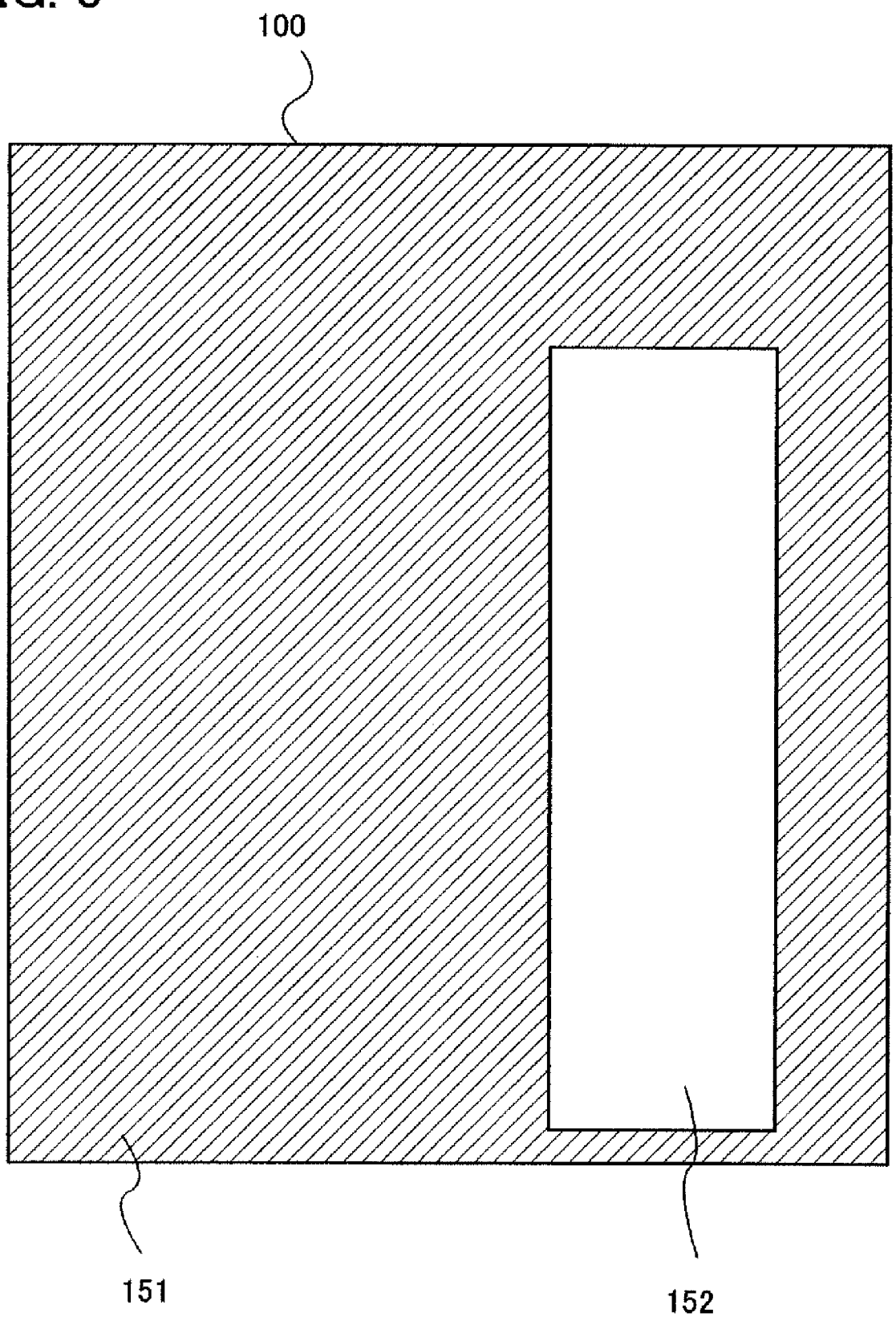
FIG. 3 is a top view of a semiconductor device of the present invention.

FIG. 2 illustrates a top view of the electrode 122 and the periphery thereof in FIG. 6A.

Further, in FIG. 2, since the electrode 122 is an electrode having a rectangular shape with a round end, in the cross-sectional view, only one electrode 122 seems to be formed as shown in FIG. 6A.

Note that in FIG. 2, the electrode 122 is electrically connected to the current mirror circuit 261. The current mirror circuit 261 has two to (n+1) TFTs 111.

Specifically, as described above, when the ratio of reference current to output current of 1:1 is desired, one each of a reference TFT and an output TFT may be formed as shown in the circuit diagram of FIG. 9. Further, when the ratio of reference current to output current of 1:n is desired, one reference TFT and n number of output TFTs may be formed. Circuit diagrams of those cases are shown in FIGS. 10A and 10B.

The current mirror circuit 261 is electrically connected to a connection electrode 162 connected to the high potential power supply $V_{DD}$ through a wiring 244, and further electrically connected to a connection electrode 163 connected to the low potential power supply $V_{SS}$ through a wiring 245 (FIG. 2).

Figure 6B:
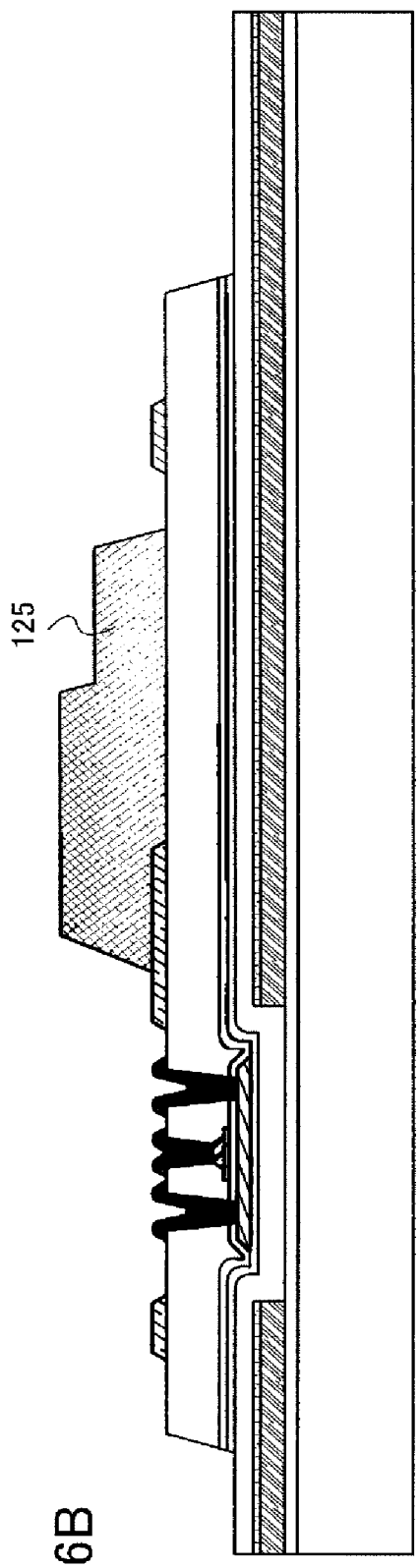
Figure 6C:
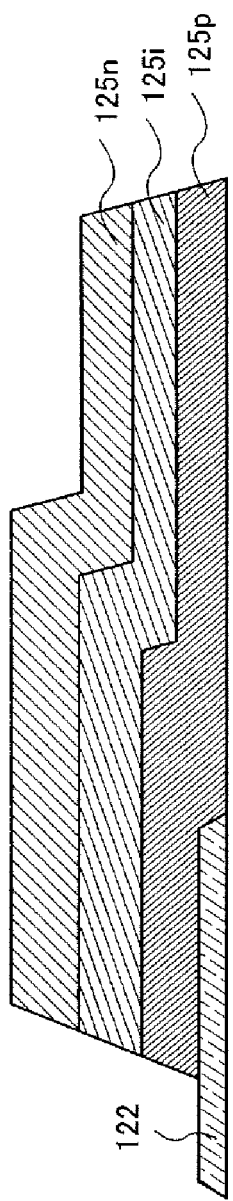

Next, p-type semiconductor layer, i-type semiconductor layer, and n-type semiconductor layer are formed over the electrode 122 and the interlayer insulating layer 112, and then etched to form a photoelectric conversion layer 125 including a p-type semiconductor layer 125p, an i-type semiconductor layer 125i, and an n-type semiconductor layer 125n (see FIGS. 6B and 6C). FIG. 6C is an enlarged view of the electrode 122 and the photoelectric conversion layer 125 in FIG. 6B.

In order to smoothen a bump of end portions of the photoelectric conversion layer 125, a sectional area of a region, in which the photoelectric conversion layer 125 and the electrode 122 overlap with each other, can be as small as possible.

The p-type semiconductor layer 125p may be formed by using an amorphous semiconductor layer including an impurity element in the group 13 such as boron (B) by plasma CVD.

The electrode 122 is in contact with the lowest layer of the photoelectric conversion layer 125 in FIGS. 6B and 6C. In this embodiment mode, the electrode 122 is in contact with the p-type semiconductor layer 125p.

After the p-type semiconductor layer 125p is formed, the i-type semiconductor layer 125i and the n-type semiconductor layer 125n are sequentially formed. In this manner, the photoelectric conversion layer 125 including the p-type semiconductor layer 125p, i-type semiconductor layer 125i, and the n-type semiconductor layer 125n is formed.

As the i-type semiconductor layer 125i, for example, an amorphous semiconductor layer can be formed by plasma CVD. In addition, as the n-type semiconductor layer 125n, an amorphous semiconductor layer including an impurity element in group 15 such as phosphorus (P) can be formed. Alternatively, after the amorphous semiconductor layer is formed, an impurity element in group 15 can be introduced.

Note that an amorphous silicon layer, an amorphous germanium layer, or the like can be used as the amorphous semiconductor layer.

In this specification, the i-type semiconductor layer is a semiconductor layer in which an impurity element imparting p-type or n-type conductivity is at a concentration of $1 \times 10^{20}$ cm$^{-3}$ or less, oxygen and nitrogen are at a concentration of $5 \times 10^{19}$ cm$^{-3}$ or less, and a photoconductivity is 100 times or more as high as dark conductivity. In addition, 10 to 1000 ppm of boron (B) can be added to the i-type semiconductor layer.

In addition, not only an amorphous semiconductor layer but also a microcrystalline semiconductor layer (also referred to as a semi-amorphous semiconductor layer) can be used as the p-type semiconductor layer 125p, the i-type semiconductor layer 125i, and the n-type semiconductor layer 125n.

Alternatively, the p-type semiconductor layer 125p and the n-type semiconductor layer 125n can be formed by using microcrystalline semiconductor layers, and the i-type semiconductor layer 125i can be formed by using an amorphous semiconductor layer.

Note that a semi-amorphous semiconductor layer includes a semiconductor having an intermediate structure between an amorphous semiconductor and a semiconductor layer having a crystalline structure (including single crystal and polycrystal). The semi-amorphous semiconductor layer is a semiconductor layer having a third state which is stable in free energy and is a crystalline substance with a short-range order and lattice distortion. Also, semi-amorphous semiconductor layer can have the crystalline grain of 0.5 to 20 nm diameter dispersed in a non-single crystalline semiconductor layer. Raman spectrum of the semi-amorphous semiconductor layer shifts to a wave number side lower than 520 cm$^{-1}$, and X-ray diffraction peaks of (111) and (220) which are derived from a silicon crystalline lattice are observed. Further, the semi-amorphous semiconductor layer contains hydrogen or halogen of at least 1 atomic % or more to terminate dangling bonds. In this specification, such a semiconductor layer is referred to as a semi-amorphous semiconductor (SAS) layer for convenience. When a rare gas element such as helium, argon, krypton, or neon is contained to further increase the lattice distortion, stability can be enhanced, and a favorable semi-amorphous semiconductor layer can be obtained. Note that a microcrystalline semiconductor layer (a microcrystal semiconductor layer) is also included in the semi-amorphous semiconductor layer.

In addition, the SAS layer can be obtained by glow discharge decomposition of a gas containing silicon. As a typical gas containing silicon, $SiH_4$, or $Si_2H_6$, $SiH_2Cl_2$, $SiHCl_3$, $SiCl_4$, $SiF_4$, or the like can be used. Further, when the gas containing silicon is diluted with hydrogen or with a gas in which one or more of rare gas elements of helium, argon, krypton, and neon are added to hydrogen, the SAS layer can be easily formed. The gas containing silicon is preferably diluted at a dilution ratio in the range of 2 to 1000 times. Further, a carbide gas such as $CH_4$ or $C_2H_6$; a germanium gas such as $GeH_4$ or $GeF_4$; $F_2$; or the like may be mixed into the gas containing silicon to adjust the energy bandwidth to be 1.5 to 2.4 eV or 0.9 to 1.1 eV.

Note that, in some cases, the photoelectric conversion layer 125, the photodiode 253 including the photoelectric conversion layer 125, and the element 100 including the photodiode 253 are also referred to as a photoelectric conversion in this specification.

Next, the protective layer 129 is formed so as to cover the exposed surface (see FIG. 7A). In this embodiment mode, a silicon nitride layer is used as the protective layer 129. The protective layer 129 is provided in order to prevent the gate wiring 211, the source electrode 212, and the drain electrode 213 of the TFT 111 from being etched when the interlayer insulating layer 131 is etched in the following step.

In addition, since the end portions of the insulating layer 105, the gate insulating layer 107, and the interlayer insulating layer 112 have the tapered shape, coverage of the protective layer 129 is improved, and water, impurities, and the like are less likely to get inside.

Next, the interlayer insulating layer 131 is formed over the protective layer 129 (see FIG. 7B). The interlayer insulating layer 131 also functions as a planarizing layer. In this embodiment mode, a polyimide layer with a thickness of 2 μm is formed as the interlayer insulating layer 131.

Next, a contact hole is formed by etching the interlayer insulating layer 131. The gate wiring 211, the source electrode 212, and the drain electrode 213 of the TFT 111 are not etched due to the protective layer 129. Then, the protective layer 129 in a region where the electrodes 132 and 133 are formed is removed by etching to form a contact hole.

Moreover, the electrode 132 is formed over the interlayer insulating layer 131. The electrode 132 is electrically connected to the electrode 121 through the contact hole which is formed in the interlayer insulating layer 131 and the protective layer 129. In addition, the electrode 133 is formed. The electrode 133 is electrically connected to the electrode 123 and the upper layer (in this embodiment mode, the n-type semiconductor layer 125n) of the photoelectric conversion layer 125 through the contact hole formed in the interlayer insulating layer 131 and the protective layer 129 (see FIGS. 8A and 8B). As the electrodes 132 and 133, tungsten (W), titanium (Ti), tantalum (Ta), silver (Ag), or the like can be used.

In this embodiment mode, a conductive layer formed of titanium (Ti) with a thickness of 30 to 50 nm is used as the electrodes 132 and 133.

Figure 8A:
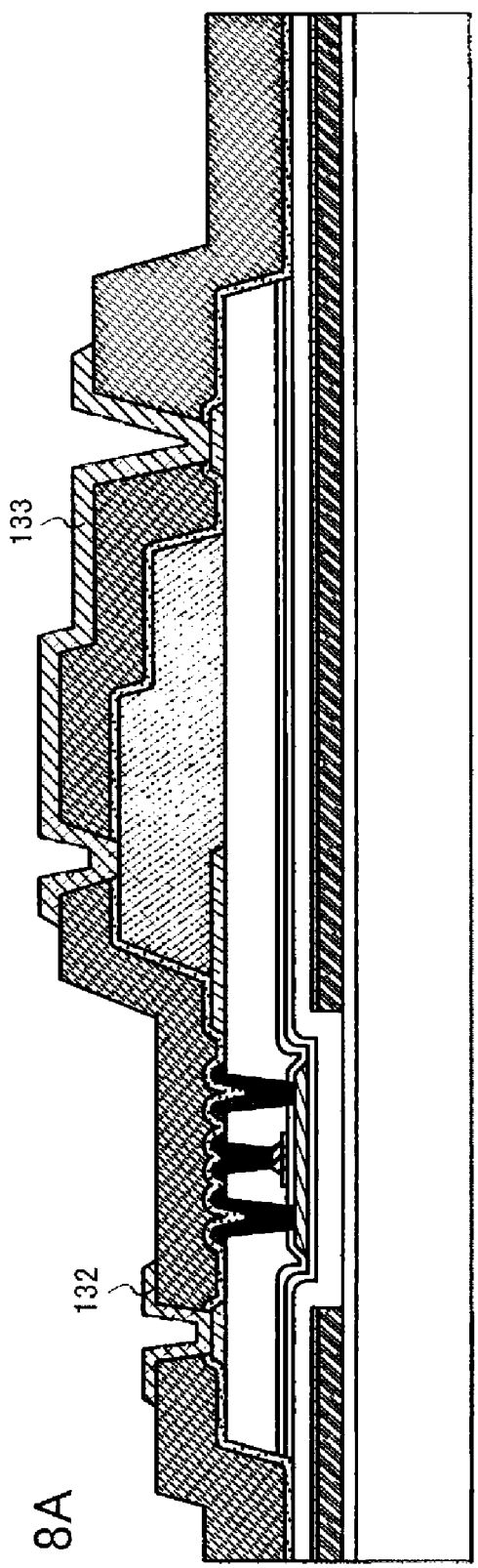
FIGS. 8A and 8B are cross-sectional views of a manufacturing process of a semiconductor device of the present invention.
Figure 8B:
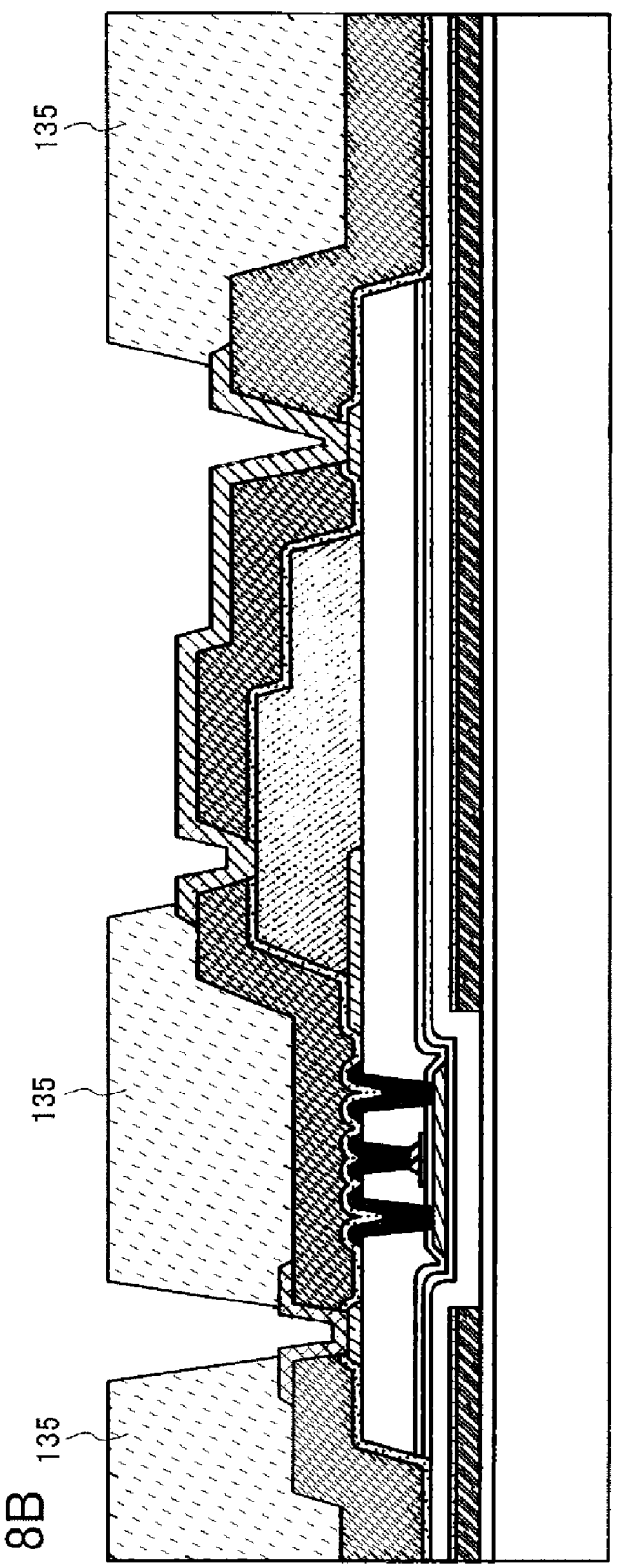

Next, an interlayer insulating layer 135 is formed over the interlayer insulating layer 131 by screen printing method or inkjet method (see FIG. 8B). At that time, the interlayer insulating layer 135 is not formed over the electrodes 132 and 133. In this embodiment mode, an epoxy resin is used as the interlayer insulating layer 135.

Next, electrodes 141 and 142, which are electrically connected to the electrodes 132 and 133, respectively, are formed by using, for example, a nickel (Ni) paste by screen printing method. Moreover, electrodes 144 and 145 are formed over the electrodes 141 and 142, respectively, by using a copper (Cu) paste by screen printing method (see FIG. 1).

Figure 12:
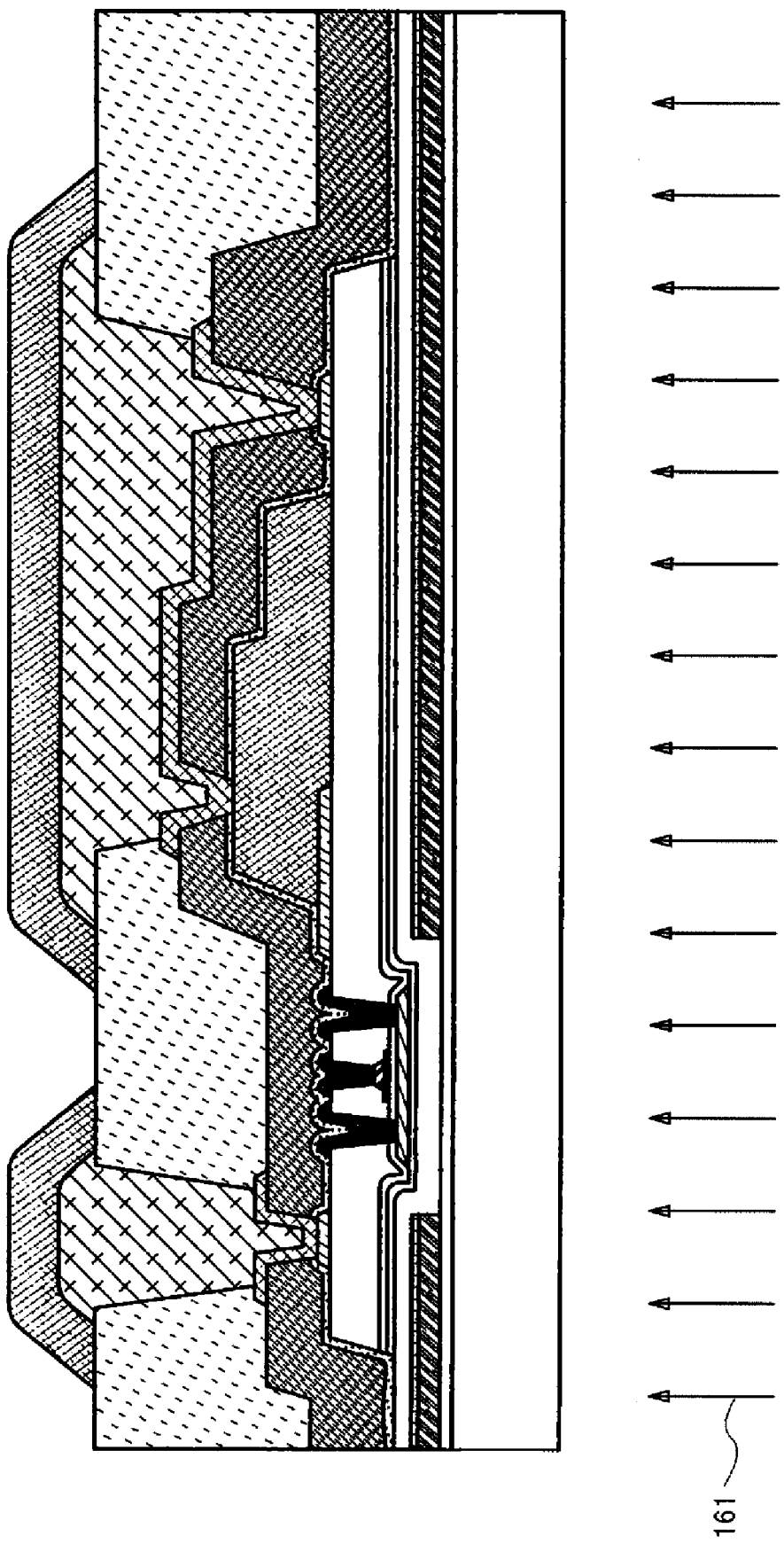
FIG. 12 is a cross-sectional view of a manufacturing step of a semiconductor device of the present invention.

Next, the substrate 101 is irradiated with a laser beam 161 from the back side (see FIG. 12). As the laser beam 161, a laser beam having energy which can be absorbed into at least the release layer 109 is used. Typically, the laser beam 161 in the UV region, visible region, or infrared region is selected as appropriate for irradiation As the energy density of the laser beam 161, an energy density, which is enough for weakening adhesive force of the release layer 109, typically in a range of 50 mJ/cm$^2$ to 500 mJ/cm$^2$ can be given. Further, when an excimer laser beam (wavelength: 308 nm) is used as the laser beam 161, an energy density is preferably in a range of 200 mJ/cm$^2$ to 300 mJ/cm$^2$ which is enough for weakening adhesive force of the release layer 109. If at least the release layer 109 is irradiated with the laser beam 161, adhesive force of the release layer 109 which is irradiated with the laser beam 161 is weakened. By removing the release layer 109 whose adhesive force is weakened, the substrate 101 and the insulating layer 102 can be separated from the elements (see FIG. 13).

The elements separated from the substrate 101 and the insulating layer 102 can be attached to another substrate, a color filter, or the like.

The case where a color filter is attached will be described below. An insulating layer 332, a metal layer 333, a release layer 330 on the surface of the metal layer 333, and the insulating layer 334 are formed over a substrate 331. As the material for the substrate 331, the same material as the substrate 101 can be used. Similarly, the same material as the insulating layer 102 is used for the insulating layer 332; the metal layer 103 and the release layer 109, for the metal layer 333 and the release layer 330; and the insulating layer 104, for the insulating layer 334.

In this embodiment mode, a glass substrate is used for the substrate 331; a silicon oxide layer including nitrogen, for the insulating layer 332; a tungsten (W) layer, for the metal layer 333; and the silicon oxide layer including nitrogen, for the insulating layer 334. The release layer 330 can be obtained by oxidizing the surface of the metal layer 333 like as the release layer 109.

A color filter 335 is formed over part of or the entire surface of the insulating layer 334.

As a manufacturing method of the color filter 335, a heretofore known technique such as etching method by using a colored resin, color resist method by using a color resist, staining method, electrodeposition method, micelle electrolyszation method, electrodeposition transfer method, film dispersion method, inkjet method (droplet discharging), or silver salt color development method can be used.

In this embodiment mode, the color filter is formed by etching method using a photosensitive resin in which colorant is dispersed. A photosensitive acrylic resin in which a red, green, or blue colorant is dispersed is coated on the insulating layer 334 by coating method. The acrylic resin is dried, temporarily baked, exposed and developed, and then the acryl is hardened by heating at 220° C. to form the color filter 335 with a thickness of 1.0 to 2.5 μm.

Note that a position of the color filter 335 is adjusted to the region where the photoelectric conversion layer 125 is formed after attachment by an adhesive agent.

An overcoat layer 336 is formed so as to cover the color filter 335 (see FIG. 14A). The overcoat layer 336 can be formed of a light-transmitting insulating material. For example, an organic resin material such as acryl or polyimide, or an inorganic material such as silicon nitride, silicon oxide, silicon oxide layer including nitrogen, or silicon nitride including oxide can be used. Alternatively, a stacked layer of these materials can be used. In this embodiment mode, polyimide is used for the overcoat layer 336.

Similarly as shown in FIG. 12, the substrate 331 is irradiated with the laser beam 161 from the side where the release layer 330 of the substrate 331 and the color filter 335 are not formed (referred to as "back side" in this specification). Then, the insulating layer 334, the color filter 335, and the overcoat layer 336 are separated from the substrate 331 and the insulating layer 332 by the laser irradiation (see FIG. 14B).

Figure 15:
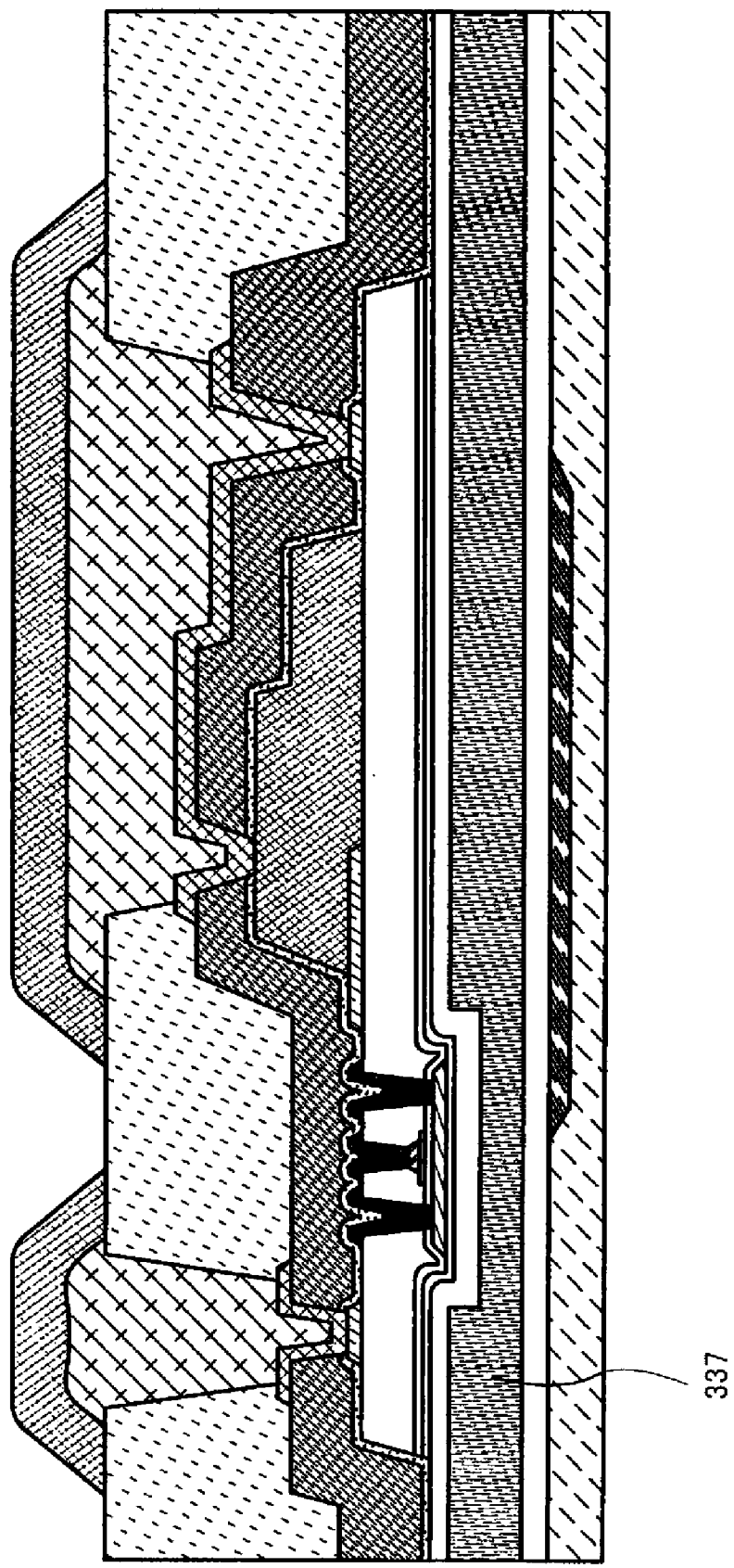
FIG. 15 is a cross-sectional view of a manufacturing process of a semiconductor device of the present invention.

Next, the insulating layer 104 and the insulating layer 334 are attached to each other by the adhesive agent 337 (see FIG. 15). As the adhesive agent 337, various curable adhesives such as a reaction curable adhesive, a heat curable adhesive, a light curable adhesive such as an ultraviolet curable adhesive, and an anaerobiotic adhesive can be given. In this embodiment mode, an epoxy resin can be used as the adhesive agent 337.

Through the above-described steps, a semiconductor device including the photoelectric conversion element which has the photoelectric conversion layer 125, the TFT 111, and the color filter 335 can be formed.

Since the metal layer as the release layer 109 is not formed in the region 152 where the amplifier circuit such as the current mirror circuit 261 including the TFT 111 is formed, the output characteristics of the current mirror circuit 261 are not adversely affected in the semiconductor device manufactured in this embodiment mode.

Moreover, since the semiconductor device manufactured in this embodiment mode is light and thin, its volume can be smaller than that of the conventional semiconductor devices. As a result, electronic devices having these semiconductor devices can be reduced in size and weight. Further, by employing this embodiment mode, a manufacturing cost can be cut and a downsized semiconductor device can be manufactured. Furthermore, the semiconductor device manufactured in this embodiment mode has flexibility.

Embodiment Mode 2

In this embodiment mode, semiconductor devices having different structures from the ones in Embodiment Mode 1 will be described with reference to FIGS. 16 and 17.

Figure 13:
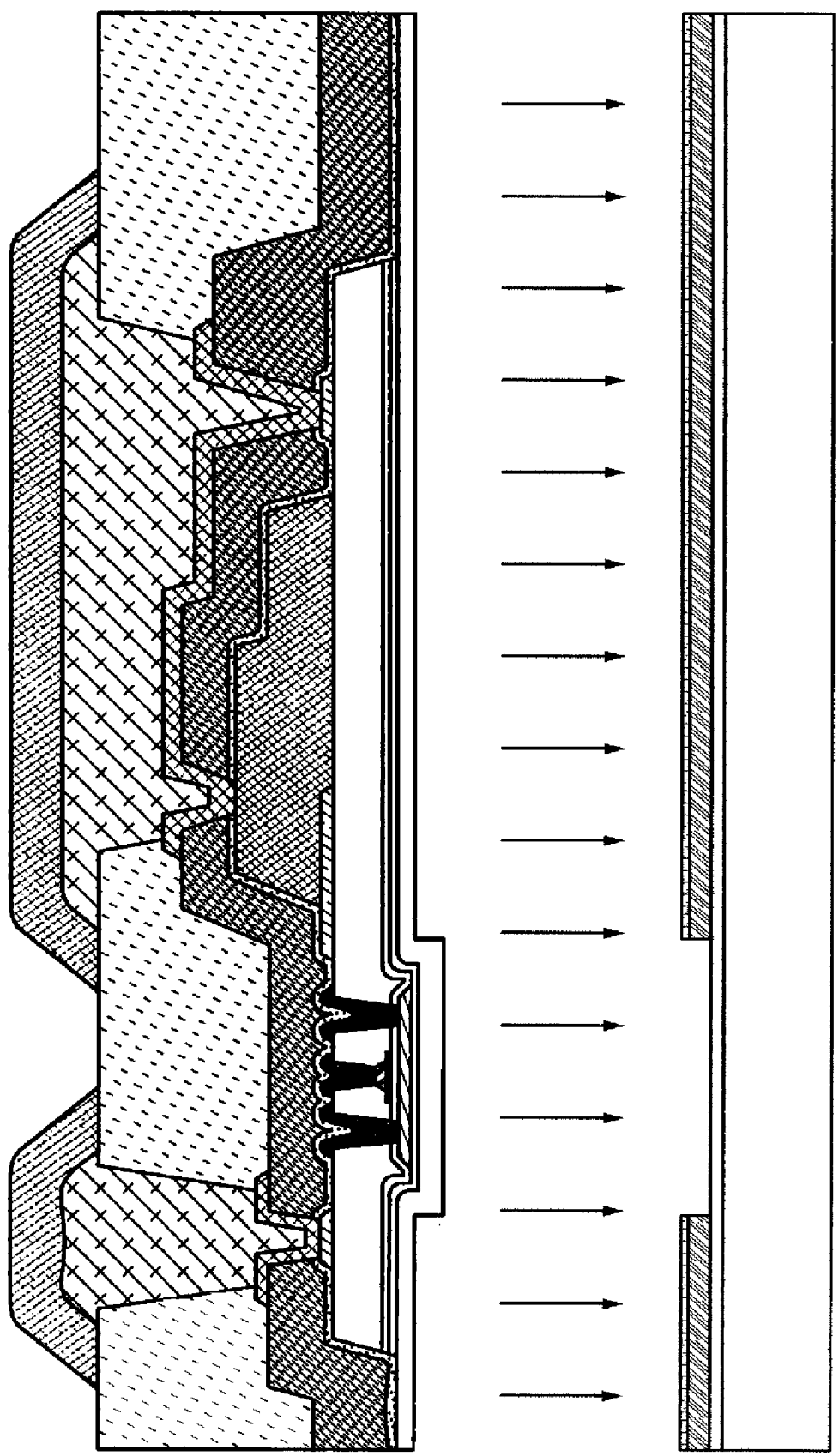
FIG. 13 is a cross-sectional view of a manufacturing process of a semiconductor device of the present invention.

First, steps up to and including the step shown in FIG. 13 is performed with reference to description of Embodiment Mode 1.

Figure 16:
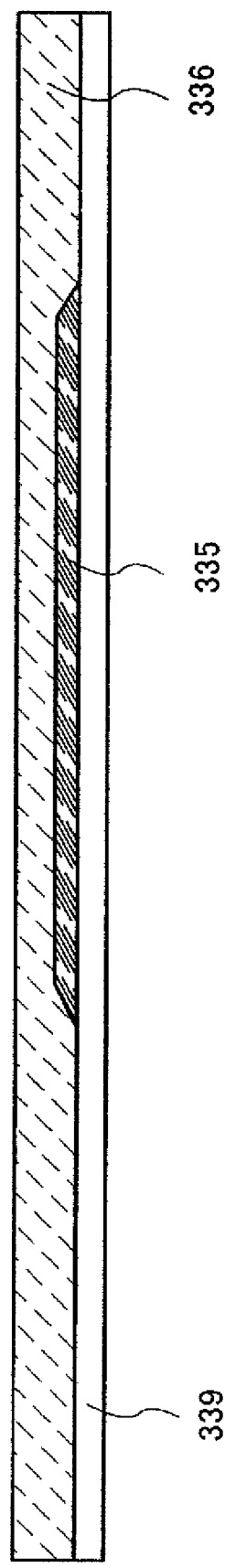
FIG. 16 is a cross-sectional view of a manufacturing process of a semiconductor device of the present invention.
Figure 17:
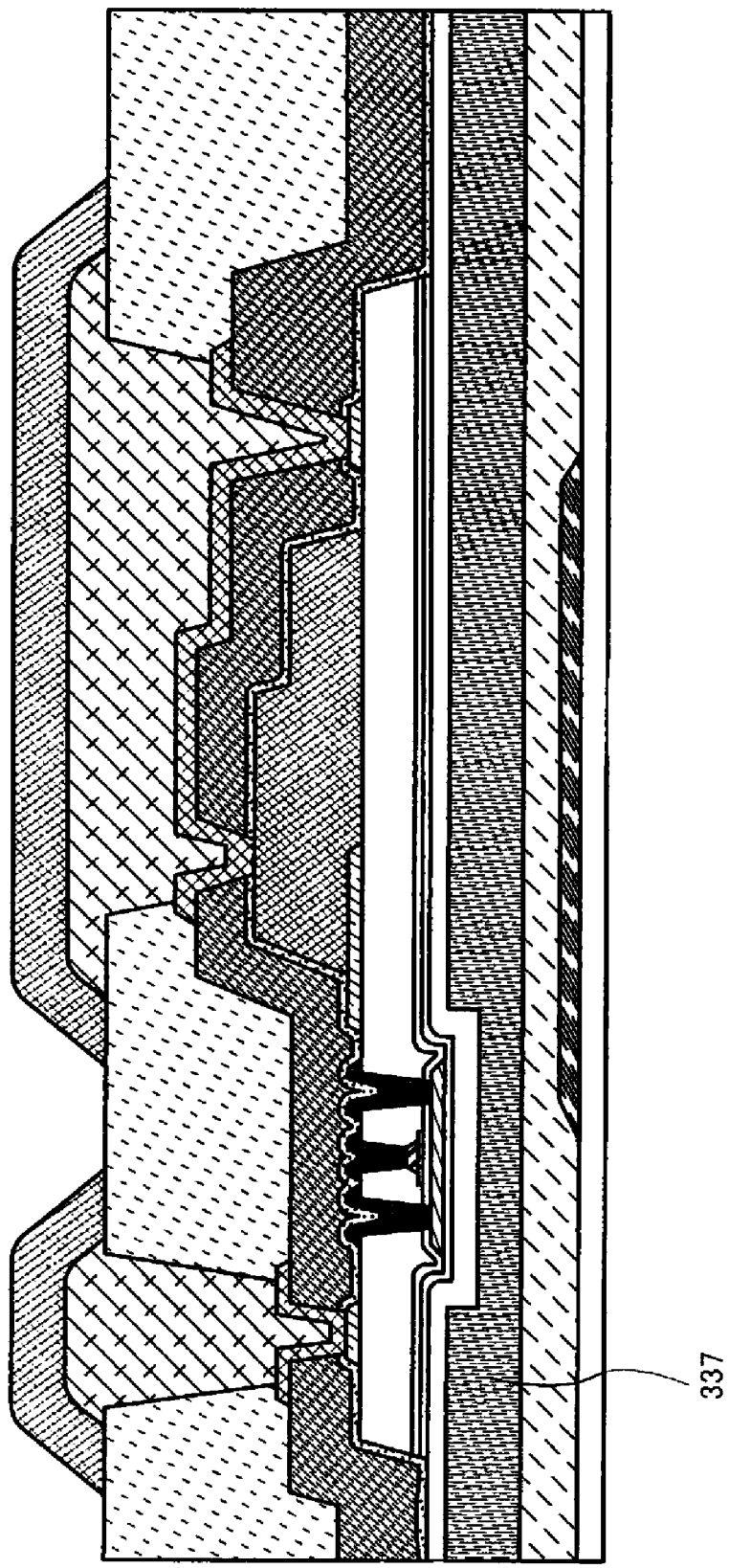
FIG. 17 is a cross-sectional view of a manufacturing process of a semiconductor device of the present invention.

As shown in FIG. 16, the color filter 335 and the overcoat layer 336 are formed over a substrate 339. The substrate 339 may be formed of the same material as the substrate 331, and the color filter 335 and the overcoat layer 336 are similar to the ones in Embodiment Mode 1.

Note that the position of the color filter 335 is adjusted to the region where the photoelectric conversion layer 125 is formed after attachment by the adhesive agent 337.

Then, as in Embodiment Mode 1, the overcoat layer 336 and the insulating layer 104 are attached to each other by the adhesive agent 337. In this manner, a semiconductor device of this embodiment mode is completed (see FIG. 17).

Since the metal layer as the release layer 109 is not formed in the region 152 where the amplifier circuit such as the current mirror circuit 261 including the TFT 111 is formed, the output characteristics of the current mirror circuit 261 are not adversely affected in the semiconductor device manufactured in this embodiment mode.

Moreover, since the semiconductor device manufactured in this embodiment mode is light and thin, its volume can be smaller than that of the conventional semiconductor devices. As a result, electronic devices having these semiconductor devices can be reduced in size and weight. Further, by employing this embodiment mode, a manufacturing cost can be cut and a downsized semiconductor device can be manufactured.

Embodiment Mode 3

Figure 18:
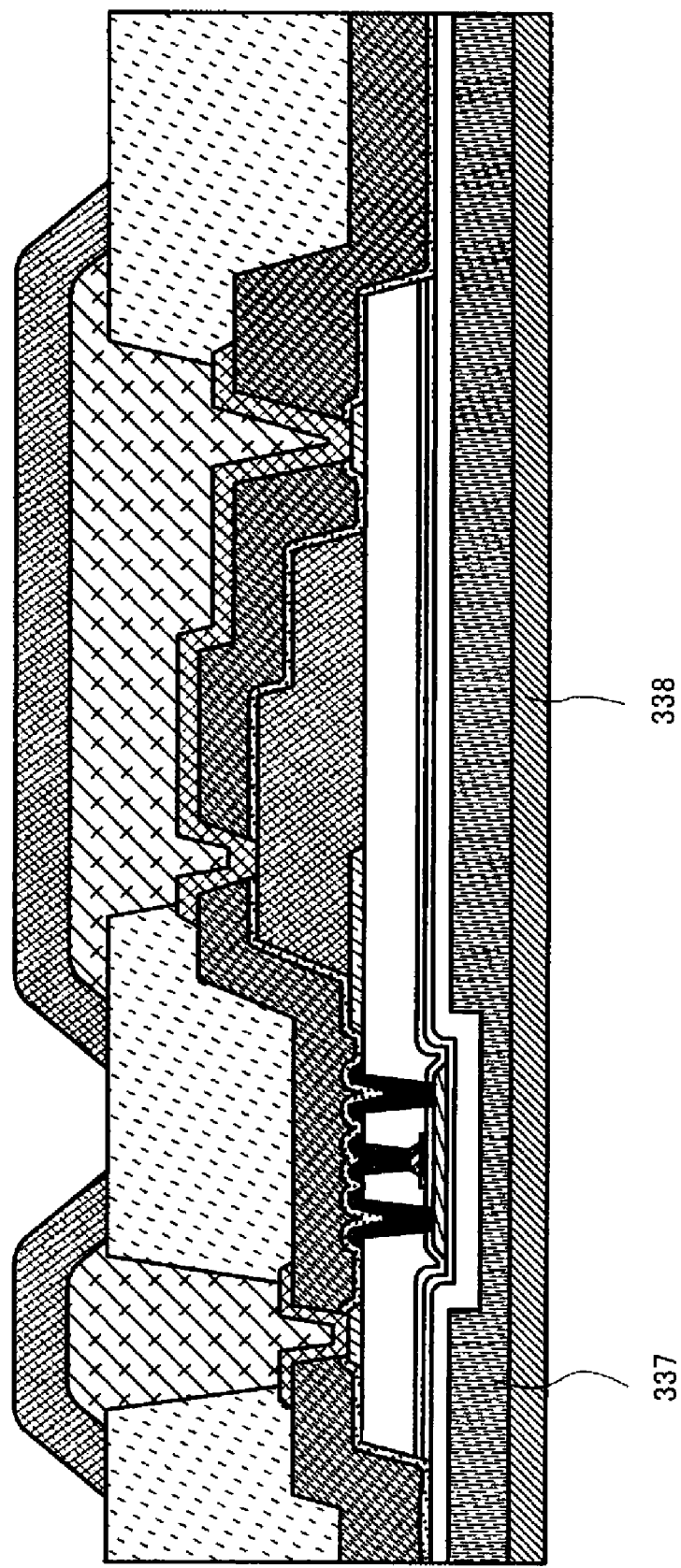
FIG. 18 is a cross-sectional view of a manufacturing process of a semiconductor device of the present invention.

In this embodiment mode, semiconductor devices having different structures from the ones in Embodiment Mode 1 and Embodiment Mode 2 will be described with reference to FIG. 18.

First, steps up to and including the step shown in FIG. 13 is performed with reference to description of Embodiment Mode 1.

Then, a color film 338 and the insulating layer 104 are attached to each other by the adhesive agent 337. In this manner, a semiconductor device of this embodiment mode is completed (see FIG. 18).

As the color film 338, a resin in which a red, green, or blue colorant is dispersed can be used.

Since the metal layer as the release layer 109 is not formed in the region 152 where the amplifier circuit such as the current mirror circuit 261 including the TFT 111 is formed, the output characteristics of the current mirror circuit 261 are not adversely affected in the semiconductor device manufactured in this embodiment mode.

Moreover, since the semiconductor device manufactured in this embodiment mode is light and thin, its volume can be smaller than that of the conventional semiconductor devices. As a result, electronic devices having these semiconductor devices can be reduced in size and weight. Further, by employing this embodiment mode, a manufacturing cost can be cut and a downsized semiconductor device can be manufactured.

Embodiment Mode 4

This embodiment mode will describe examples of various electronic devices which include semiconductor devices having photoelectric conversion elements in accordance with the invention. Examples of electronic devices to which the invention is applied include computers, displays, mobile phones, television sets, and the like. Specific examples of such electronic devices are shown in FIG. 19, FIGS. 20A and 20B, FIGS. 21A and 21B, FIG. 22, and FIGS. 23A and 23B.

Figure 19:
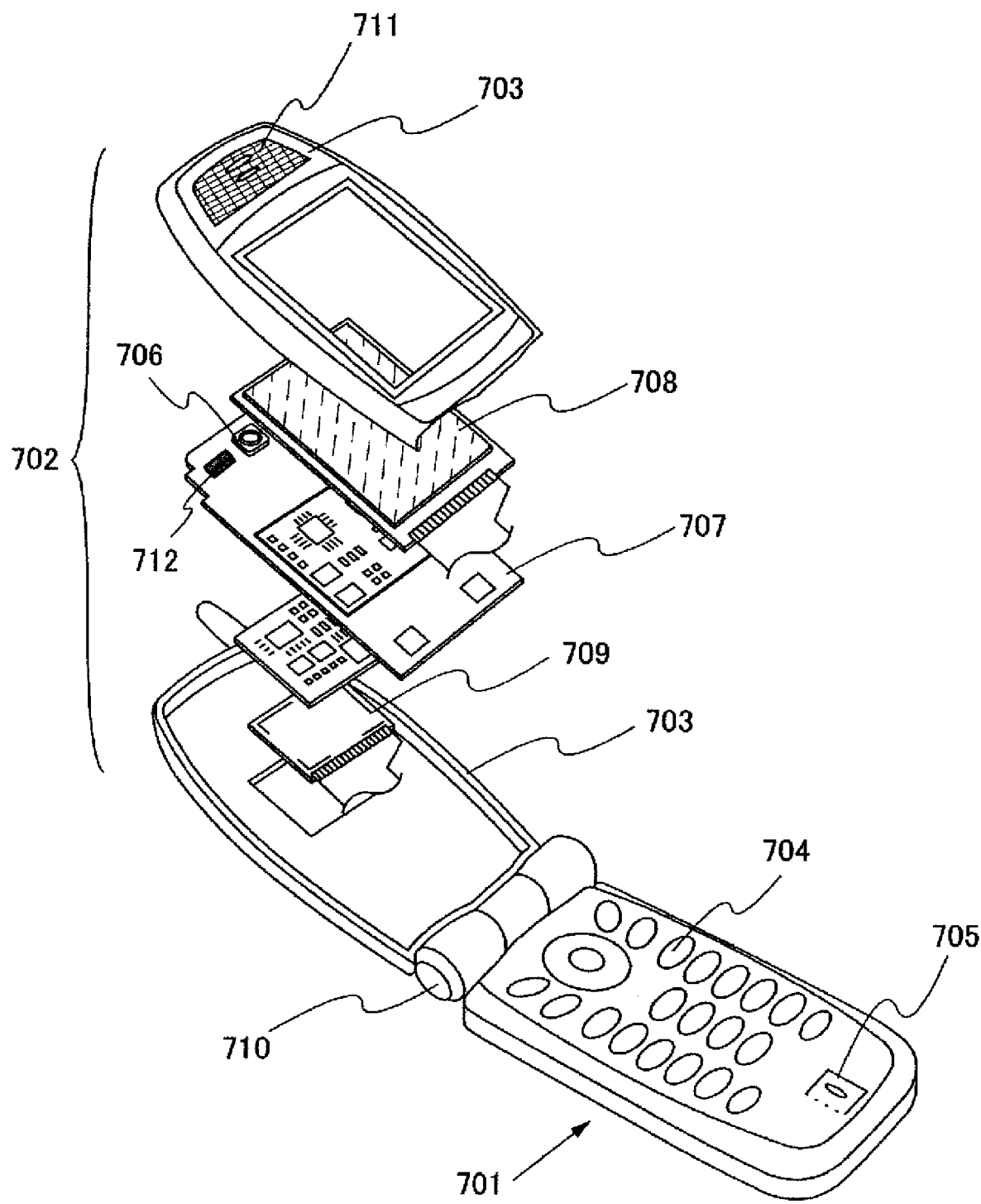
FIG. 19 is a diagram illustrating a device mounted with a semiconductor device of the present invention.

FIG. 19 illustrates a mobile phone which includes a main body (A) 701, a main body (B) 702, a housing 703, operation keys 704, an audio input portion 705, an audio output portion 706, a circuit board 707, a display panel (A) 708, a display panel (B) 709, a hinge 710, a light-transmitting material portion 711, and a photoelectric conversion element 712. A semiconductor device obtained in accordance with Embodiment Mode 1 to Embodiment Mode 3 can be applied to the photoelectric conversion element 712.

The photoelectric conversion element 712 detects light that has passed through the light-transmitting material portion 711, and controls the luminance of the display panel (A) 708 and the display panel (B) 709 as well as controlling the lighting of the operation keys 704 in accordance with the illuminance of outside light that has been detected by the photoelectric conversion element 712. Accordingly, power consumption of the mobile phone can be suppressed.

Figure 20A:
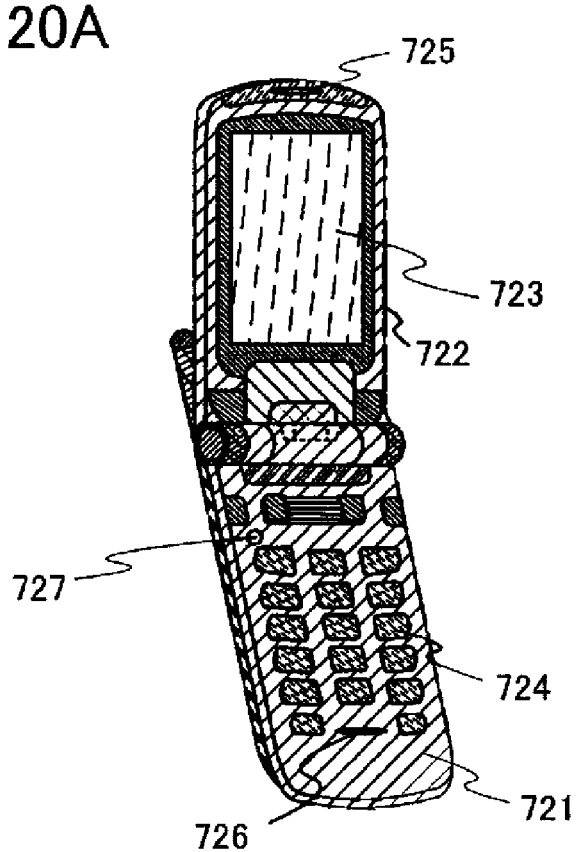
FIGS. 20A and 20B are diagrams illustrating a device mounted with a semiconductor device of the present invention.
Figure 20B:
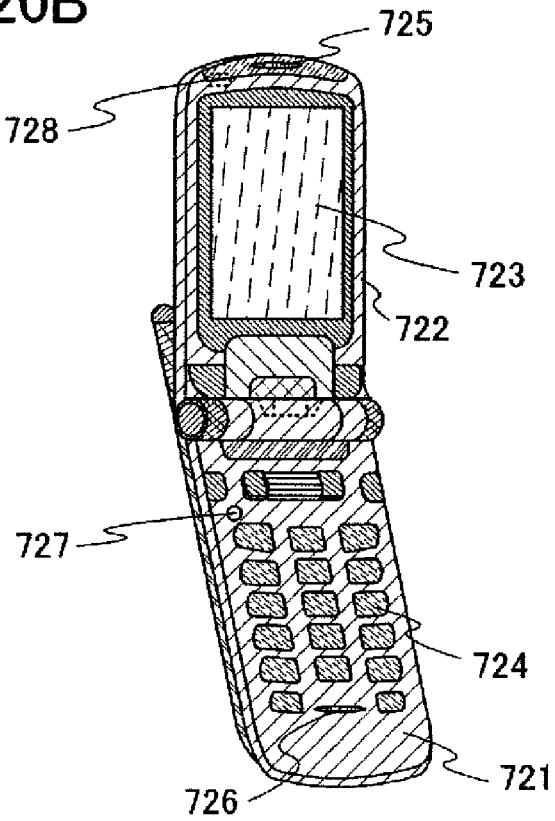

FIGS. 20A and 20B illustrate other examples of mobile phones. In FIGS. 20A and 20B, reference numeral 721 denotes a main body; 722, a housing; 723, a display panel; 724, operation keys; 725, an audio output portion; 726, an audio input portion; and 727 and 728, photoelectric conversion elements.

A semiconductor device obtained in accordance with Embodiment Mode 1 to Embodiment Mode 3 can be applied to the photoelectric conversion elements 727 and 728.

In the mobile phone shown in FIG. 20A, luminance of the display panel 723 and the operation keys 724 can be controlled by detecting outside light with the photoelectric conversion element 727 provided in the main body 721.

In the mobile phone shown in FIG. 20B, the photoelectric conversion element 728 is provided inside the main body 721 in addition to the structure of FIG. 20A. With the photoelectric conversion element 728, luminance of a backlight provided in the display panel 723 can also be detected.

Figure 21A:
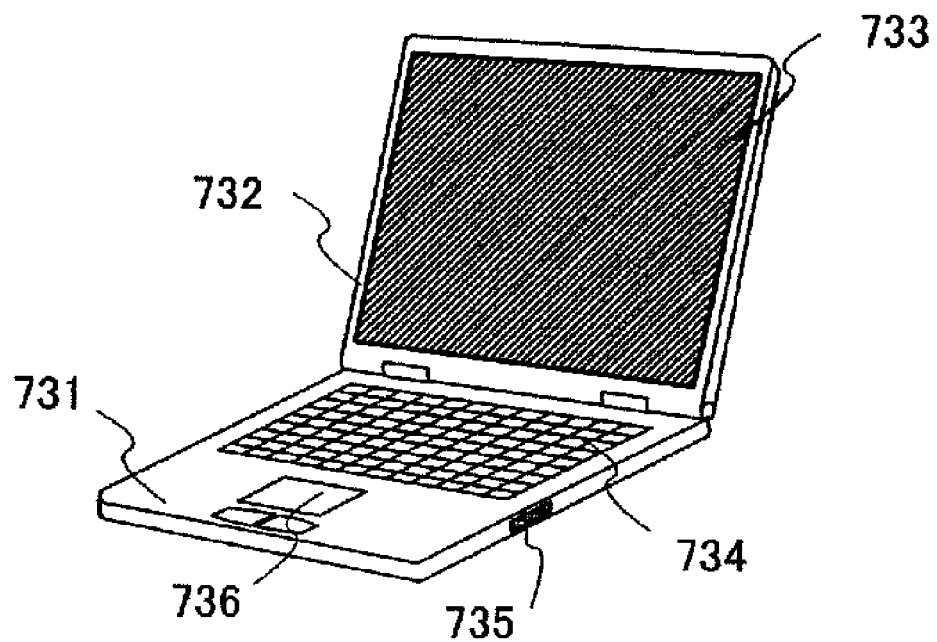
FIGS. 21A and 21B are diagrams each illustrating a device mounted with a semiconductor device of the present invention.

FIG. 21A illustrates a computer which includes a main body 731, a housing 732, a display portion 733, a keyboard 734, an external connection port 735, a pointing device 736, and the like.

Figure 21B:
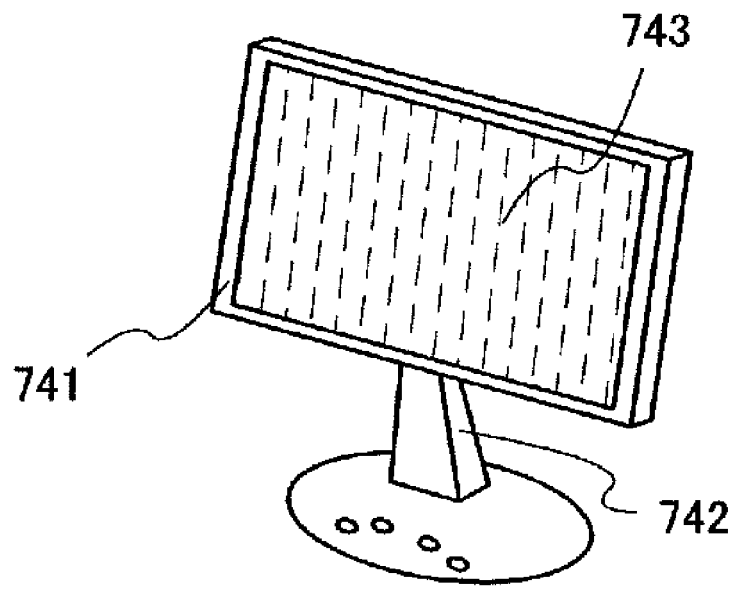

FIG. 21B illustrates a display device which corresponds to a television receiver or the like. The display device includes a housing 741, a supporting base 742, a display portion 743, and the like.

Figure 22:
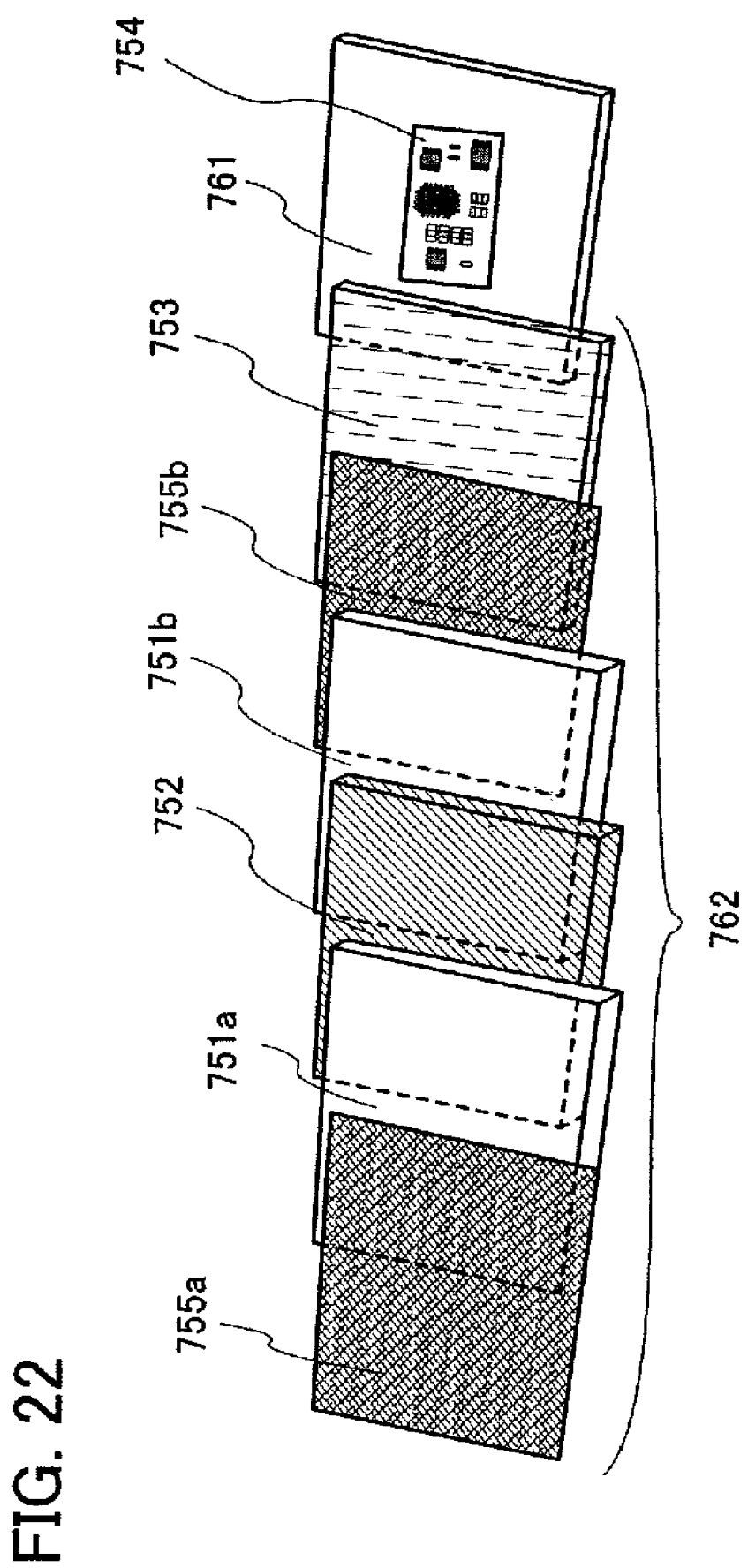
FIG. 22 is a diagram illustrating a device mounted with a semiconductor device of the present invention.

FIG. 22 illustrates a specific configuration where a liquid crystal panel is used as the display portion 733 provided in the computer shown in FIG. 21A and the display portion 743 of the display device shown in FIG. 21B.

A liquid crystal panel 762 shown in FIG. 22 is built into a housing 761, and includes substrates 751a and 751b, a liquid crystal layer 752 sandwiched therebetween, polarization filters 755a and 755b, a backlight 753, and the like. In the housing 761, a photoelectric conversion element formation region 754 having a photoelectric conversion element is formed.

A semiconductor device of the present invention can also be applied to the photoelectric conversion element in FIG. 22.

The photoelectric conversion element formation region 754 fabricated in accordance with the invention detects the amount of light from the backlight 753, and the data of which is fed back to control the luminance of the liquid crystal panel 762.

Figure 23A:
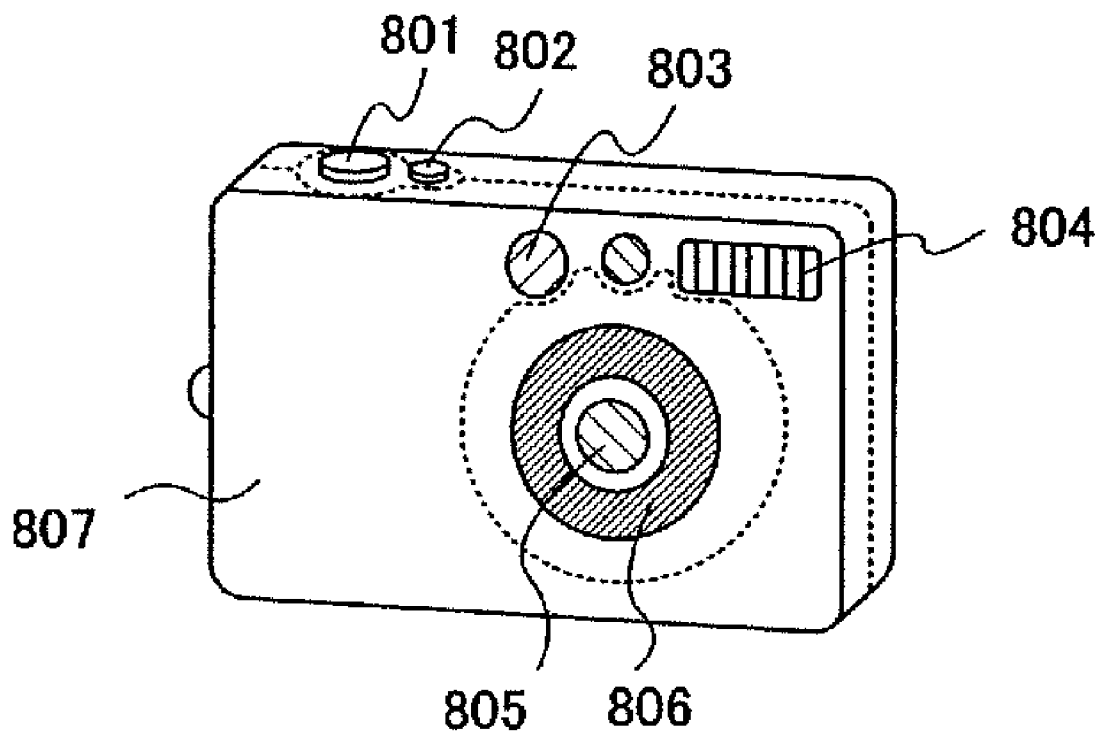
FIGS. 23A and 23B are diagrams illustrating a device mounted with a semiconductor device of the present invention.
Figure 23B:
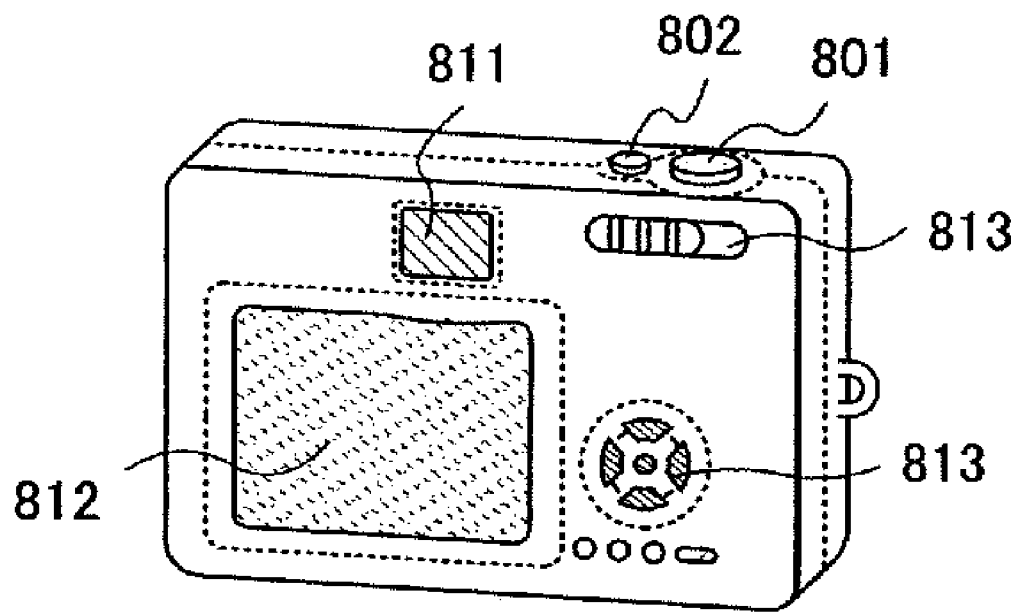

FIGS. 23A and 23B illustrate an example where a device of the present invention is built into a camera, e.g., a digital camera. FIG. 23A is a perspective view of the digital camera seen from the front side, and FIG. 23B is a perspective view thereof seen from the rear side. Referring to FIG. 23A, the digital camera is provided with a release button 801, a main switch 802, a viewfinder 803, a flash portion 804, a lens 805, a barrel 806, and a housing 807.

Referring to FIG. 23B, the digital camera is also provided with a viewfinder eyepiece 811, a monitor 812, and operation buttons 813.

When the release button 801 is pushed down to the half point, a focus adjustment mechanism and an exposure adjustment mechanism are activated. When the release button is pushed down to the lowest point, a shutter opens.

By pushing down or rotating the main switch 802, power of the digital camera is switched on or off.

The viewfinder 803 is located above the lens 805 on the front side of the digital camera, for checking the shooting range and the focus point from the viewfinder eyepiece 811 shown in FIG. 23B.

The flash portion 804 is located in the upper portion of the front side of the digital camera. When the luminance of the object is not enough, the release button may be pushed down to open the shutter and irradiate auxiliary light from the flash portion 804 at the same time.

The lens 805 is located at the front side of the digital camera and includes a focusing lens, a zoom lens, and the like. This lens, in conjunction with a shutter button and a diaphragm (not shown), constitutes an imaging optical system. Behind the lens, an imaging device such as a CCD (charge coupled device) is provided.

The barrel 806 moves the position of the lens to adjust the focus of the focusing lens, the zoom lens, and the like. In shooting, the barrel is slid out to move the lens 805 forward. When carrying the digital camera, the lens 805 is retracted to be compact. Note that a structure is employed in this embodiment mode in which the photographic subject can be zoomed and shot by sliding out the barrel; however, the invention is not limited to this structure. For example, a digital camera may be constructed which can zoom and shoot the photographic subject without sliding out the barrel with the use of the imaging optical system inside the housing 807.

The viewfinder eyepiece 811 is located in the upper portion of the rear side of the digital camera for looking therethrough in checking the shooting range and the focus point.

The operation buttons 813 are buttons with various functions provided on the rear side of the digital camera, which include a setup button, a menu button, a display button, a function button, a selection button, and the like.

When a device of the present invention is built into the camera shown in FIGS. 23A and 23B, presence and intensity of outside light can be detected with the device of the invention; thus, exposure adjustment and the like of the camera can be performed.

In addition, a device of the present invention can also be applied to other electronic devices such as a projection TV and a navigation system. That is, the device of the invention can be applied to any object which needs to detect light.

The present application is based on Japanese Priority Patent Application No. 2007-073186 filed on Mar. 20, 2007 with the Japan Patent Office, the entire contents of which are hereby incorporated by reference.

What is claimed is:

1. A method for manufacturing a semiconductor device, comprising the steps of:
    forming a first insulating layer over a substrate;
    forming a metal layer over the first insulating layer;
    forming a release layer by oxidizing a surface of the metal layer;
    exposing the first insulating layer by forming an opening portion in the metal layer and the release layer;
    forming a second insulating layer over the opening portion and the release layer;
    forming a photoelectric conversion element over the second insulating layer, wherein the photoelectric conversion element overlaps the metal layer;
    forming an amplifier circuit, which is configured to amplify an output current of the photoelectric conversion element, wherein the amplifier circuit comprises a thin film transistor formed in the opening portion so that the amplifier circuit does not overlap the release layer;
    forming a protective layer over the photoelectric conversion element and the amplifier circuit; and
    separating the photoelectric conversion element and the amplifier circuit, together with the second insulating layer from the substrate using the release layer.

2. A method for manufacturing a semiconductor device according claim 1, wherein the amplifier circuit is a current mirror circuit.

3. A method for manufacturing a semiconductor device, comprising the steps of:
    forming a first insulating layer over a substrate;
    forming a metal layer over the first insulating layer;
    forming a release layer by oxidizing a surface of the metal layer;
    exposing the first insulating layer by forming an opening portion in the metal layer and the release layer;
    forming a second insulating layer over the opening portion and the release layer;
    forming a photoelectric conversion element over the second insulating layer, wherein the photoelectric conversion element overlaps the metal layer;
    forming an amplifier circuit, which is configured to amplify an output current of the photoelectric conversion element, wherein the amplifier circuit comprises a thin film transistor formed in the opening portion so that the amplifier circuit does not overlap the release layer;

forming a protective layer over the photoelectric conversion element and the amplifier circuit; and separating the photoelectric conversion element and the amplifier circuit, together with the second insulating layer from the substrate through laser irradiation to the release layer.

4. A method for manufacturing a semiconductor device according claim 3, wherein the amplifier circuit is a current mirror circuit.

5. A method for manufacturing a semiconductor device, comprising the steps of:

forming a first insulating layer over a substrate;

forming a metal layer over the first insulating layer;

forming a release layer by oxidizing a surface of the metal layer;

exposing the first insulating layer by forming an opening portion in the metal layer and the release layer;

forming a second insulating layer over the opening portion and the release layer;

forming a photoelectric conversion element over the second insulating layer, wherein the photoelectric conversion element overlaps the metal layer;

forming an amplifier circuit, which is configured to amplify an output current of the photoelectric conversion element, wherein the amplifier circuit comprises a thin film transistor formed in the opening portion so that the amplifier circuit does not overlap the release layer;

forming a protective layer over the photoelectric conversion element and the amplifier circuit;

separating the photoelectric conversion element and the amplifier circuit, together with the second insulating layer from the substrate using the release layer; and attaching a color filter to a photoelectric conversion layer with an adhesive agent therebetween.

6. A method for manufacturing a semiconductor device according claim 5, wherein the amplifier circuit is a current mirror circuit.

7. A method for manufacturing a semiconductor device, comprising the steps of:

forming a first insulating layer over a substrate;

forming a metal layer over the first insulating layer;

forming a release layer by oxidizing a surface of the metal layer;

exposing the first insulating layer by forming an opening portion in the metal layer and the release layer;

forming a second insulating layer over the opening portion and the release layer;

forming a photoelectric conversion element over the second insulating layer, wherein the photoelectric conversion element overlaps the metal layer;

forming an amplifier circuit, which is configured to amplify an output current of the photoelectric conversion element, wherein the amplifier circuit comprises a thin film transistor formed in the opening portion so that the amplifier circuit does not overlap the release layer;

forming a protective layer over the photoelectric conversion element and the amplifier circuit;

separating the photoelectric conversion element and the amplifier circuit, together with the second insulating layer from the substrate through laser irradiation to the release layer; and attaching a color filter to a photoelectric conversion layer with an adhesive agent therebetween.

8. A method for manufacturing a semiconductor device according claim 7, wherein the amplifier circuit is a current mirror circuit.

* * * * *